United States Patent
Abdelghafar et al.

(10) Patent No.: US 12,501,729 B2
(45) Date of Patent: Dec. 16, 2025

(54) PHOTOELECTRIC CONVERSION APPARATUS, PHOTOELECTRIC CONVERSION SYSTEM, AND MOVING OBJECT

(71) Applicant: CANON KABUSHIKI KAISHA, Tokyo (JP)

(72) Inventors: Ayman Tarek Abdelghafar, Tokyo (JP); Kazuhiro Morimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 859 days.

(21) Appl. No.: 17/695,657

(22) Filed: Mar. 15, 2022

(65) Prior Publication Data

US 2022/0302183 A1   Sep. 22, 2022

(30) Foreign Application Priority Data

Mar. 22, 2021   (JP) ................................ 2021-047086

(51) Int. Cl.
*H01L 31/062* (2012.01)
*H01L 31/113* (2006.01)
*H10F 39/00* (2025.01)
*H10F 39/18* (2025.01)

(52) U.S. Cl.
CPC ......... *H10F 39/8033* (2025.01); *H10F 39/18* (2025.01); *H10F 39/807* (2025.01)

(58) Field of Classification Search
CPC .......... H10D 8/055; H10D 8/40; H10D 8/024; H10F 30/225
See application file for complete search history.

(56) References Cited

U.S. PATENT DOCUMENTS

| | | | |
|---|---|---|---|
| 2020/0105958 A1 | 4/2020 | Sasago | |
| 2020/0350345 A1* | 11/2020 | Hiramatsu | ............ H10F 39/807 |
| 2021/0234057 A1* | 7/2021 | Lu | ........... H10F 39/811 |
| 2022/0181363 A1* | 6/2022 | Matsumoto | ............. H10F 39/18 |
| 2024/0213281 A1* | 6/2024 | Shimada | ............. H10F 39/8033 |
| 2025/0081649 A1* | 3/2025 | Nakata | ................... H04N 25/62 |

* cited by examiner

*Primary Examiner* — Ismail A Muse
(74) *Attorney, Agent, or Firm* — Canon U.S.A., Inc. IP Division

(57) ABSTRACT

An avalanche photodiode has a first semiconductor region of a first conductivity type and a second semiconductor region of a second conductivity type, the first semiconductor region being a region where charges having the same polarity as that of signal charges are treated as majority carriers. A separator provided between a first photoelectric conversion element and a second photoelectric conversion element has a trench structure. A top surface of the trench structure is positioned between a top surface of the second semiconductor region and a bottom surface of the second semiconductor region.

18 Claims, 20 Drawing Sheets

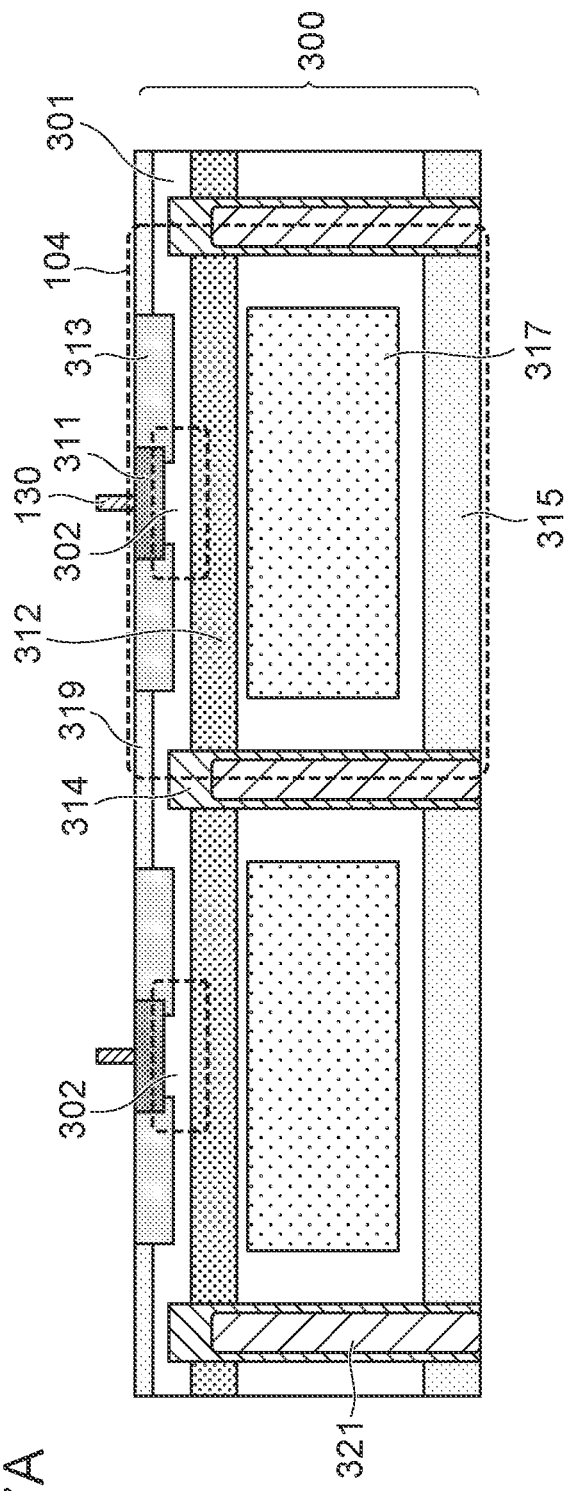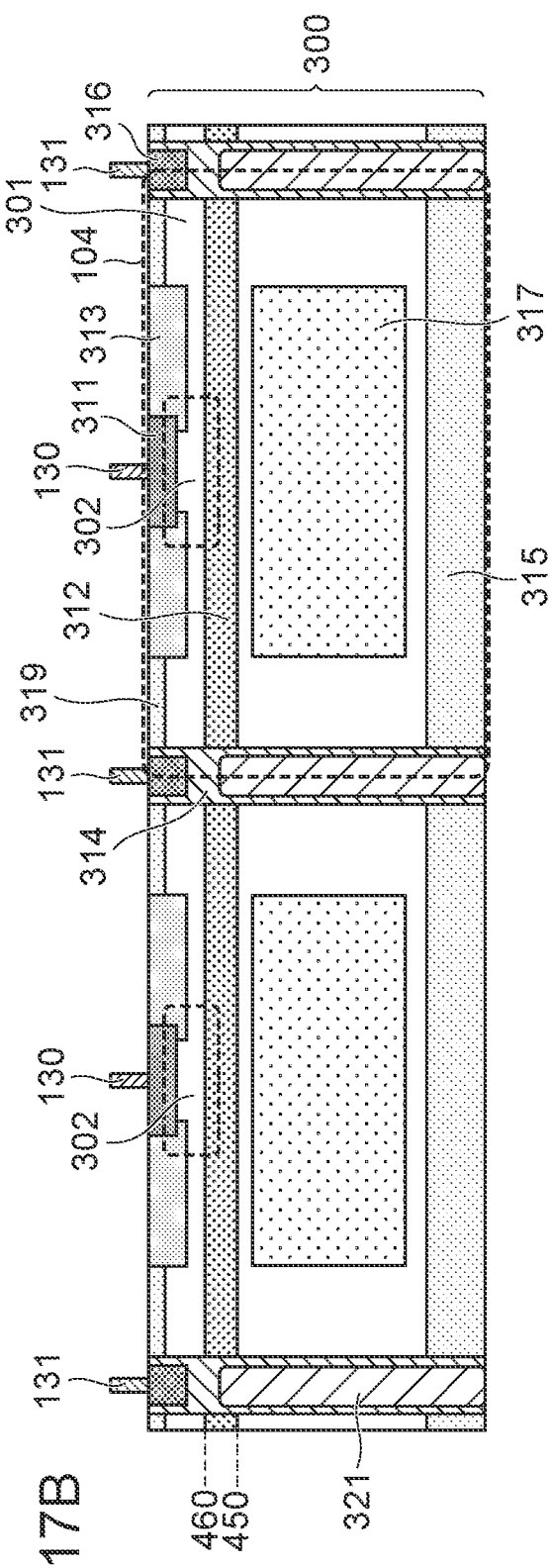

PHOTOELECTRIC CONVERSION APPARATUS, PHOTOELECTRIC CONVERSION SYSTEM, AND MOVING OBJECT

BACKGROUND

Field of the Disclosure

The aspect of the embodiments relates to a photoelectric conversion apparatus.

Description of the Related Art

A photoelectric conversion apparatus including an avalanche photodiode (APD) is known. US2020/0105958 discloses a configuration in which an avalanche multiplication region is formed by a first semiconductor region and a second semiconductor region and in which the second semiconductor region is connected to a separator, the first semiconductor region being a region where carriers of the same conductivity type as that of signal charges are treated as majority carriers, the second semiconductor region being of a second conductivity type.

Moreover, FIG. 10 of US2020/0105958 discloses that a third semiconductor region of the second conductivity type is arranged at a position deeper than the second semiconductor region and that the second semiconductor region prevents a depletion layer from excessively spreading to a deep portion of a semiconductor layer. As a result, the avalanche multiplication region is concentrated near the first semiconductor region, and avalanche multiplication can be caused at low voltage.

US2020/0105958 discloses, as separators between pixels, use of a semiconductor region of the second conductivity type and use of both of a semiconductor region and an insulation region. However, US2020/0105958 does not propose a structure of a separator appropriate for the device structure of an APD. The aspect of the embodiments provides the structure of a separator appropriate for the device configuration of an APD.

SUMMARY OF THE DISCLOSURE

A photoelectric conversion apparatus includes a semiconductor layer including a plurality of photoelectric conversion elements and having a first surface and a second surface, which is a surface on an opposite side to the first surface and on which light is incident. Each of the plurality of photoelectric conversion elements includes an avalanche photodiode. The avalanche photodiode has a first semiconductor region of a first conductivity type and a second semiconductor region of a second conductivity type, the first semiconductor region being a region where charges having the same polarity as that of signal charges are treated as majority carriers. The plurality of photoelectric conversion elements are separated from each other by a separator including a third semiconductor region of the second conductivity type. The second semiconductor region is arranged so as to be in contact with the third semiconductor region. The plurality of photoelectric conversion elements include a first photoelectric conversion element and a second photoelectric conversion element, which are aligned in a first direction. A separator provided between the first photoelectric conversion element and the second photoelectric conversion element has a trench structure. The trench structure is arranged such that a top surface of the trench structure is positioned between a top surface of the second semiconductor region and a bottom surface of the second semiconductor region.

Further features of the disclosure will become apparent from the following description of exemplary embodiments with reference to the attached drawings.

BRIEF DESCRIPTION OF THE DRAWINGS

FIGS. 17A and 17B are schematic cross-section diagrams of the photoelectric conversion apparatus according to the modification of the third embodiment.

DESCRIPTION OF THE EMBODIMENTS

Figure 1:
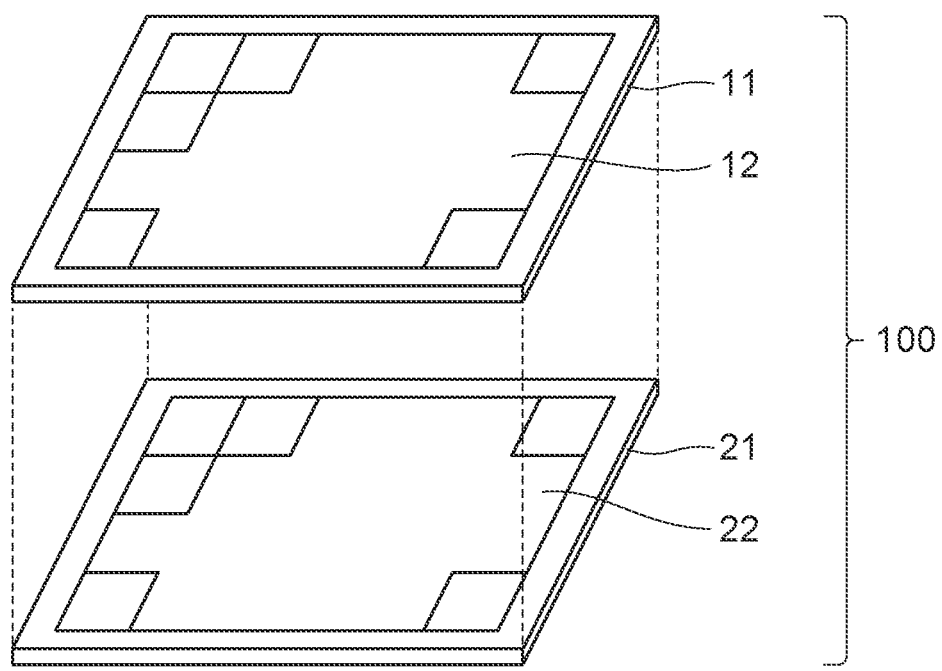
FIG. 1 is a diagram illustrating the configuration of a photoelectric conversion apparatus.

Embodiments to be described below are concretizations of the technical idea of the disclosure and are not intended to limit the scope of the disclosure. The sizes of and the positional relationship between members illustrated in the individual drawings may be exaggerated for purposes of clear illustration. In the following description, the identical configurations may be denoted by the same reference numerals, and description thereof may be omitted.

In the following, the embodiments will be described in detail on the basis of the drawings. Note that, in the following description, terms representing specific directions and positions (for example, "up", "down", "right", "left", and other terms including these terms) are used as needed. These terms are used to facilitate understanding of the embodiments with reference to the drawings, and the meanings of these terms are not intended to limit the technical scope of the disclosure.

In the following description, the anode of an avalanche photodiode (hereinafter referred to as APD) is set to a fixed electric potential, and a signal is extracted from the cathode side. Thus, a first-conductivity-type semiconductor region where charges having the same polarity as that of signal charges are treated as majority carriers is an N-type semiconductor region. A second-conductivity-type semiconductor region where charges having a different polarity from that of the signal charges are treated as majority carriers is a P-type semiconductor region. Note that the aspect of the embodiments is achieved even in a case where the cathode of the APD is set to a fixed electric potential and where a signal is extracted from the anode side. In this case, the first-conductivity-type semiconductor region where charges having the same polarity as that of signal charges are treated as majority carriers is a P-type semiconductor region, and the second-conductivity-type semiconductor region where charges having a different polarity from that of the signal charges are treated as majority carriers is an N-type semiconductor region. In the following, a case will be described where one of the nodes of an APD is set to a fixed electric potential; however, the potentials of both of the nodes may vary.

Herein, in a case where the term "impurity concentration" is simply used, the term refers to a net impurity concentration obtained by subtracting an amount added by impurities of the reverse conductivity type. That is, "impurity concentration" refers to NET doping concentration. A region where P-type doping concentration is higher than N-type doping concentration is a P-type semiconductor region. In contrast, a region where N-type doping concentration is higher than P-type doping concentration is an N-type semiconductor region.

Herein, "a plan view" refers to viewing from a direction perpendicular to a surface on the opposite side to a light incident surface of a semiconductor layer to be described below. Moreover, "cross section" refers to a surface in a direction perpendicular to a surface on the opposite side to the light incident surface of the semiconductor layer. Note that in a case where the light incident surface of the semiconductor layer is microscopically rough, a plan view is defined with reference to the light incident surface of the semiconductor layer that is viewed macroscopically.

A semiconductor layer 300 has a first surface and a second surface, which is a surface on the opposite side to the first surface and on which light is incident. Herein, a depth direction refers to a direction from the first surface, where APDs are arranged, toward the second surface of the semiconductor layer 300. In the following, there may be a case where the "first surface" is referred to as a "front surface" and a case where the "second surface" is referred to as a "back surface". A direction from a predetermined position in the semiconductor layer 300 toward the back surface of the semiconductor layer 300 may be expressed as "deep". Alternatively, a direction from a predetermined position in the semiconductor layer 300 toward the front surface of the semiconductor layer 300 may be expressed as "shallow".

First, a configuration common to the individual embodiments will be described using FIGS. 1 to 5C.

FIG. 1 is a diagram illustrating the configuration of a photoelectric conversion apparatus 100 of a multilayer type. The photoelectric conversion apparatus 100 includes two boards which are stacked one on top of the other and are electrically connected to each other. The two boards are a sensor board 11 and a circuit board 21. The sensor board 11 has a first semiconductor layer (the semiconductor layer 300) and a first wiring structure. The first semiconductor layer has photoelectric conversion elements 102, which will be described later. The circuit board 21 has a second semiconductor layer and a second wiring structure. The second semiconductor layer has, for example, signal processing units 103, which will be described later. The photoelectric conversion apparatus 100 is constituted by stacking the second semiconductor layer, the second wiring structure, the first wiring structure, and the first semiconductor layer in this order. Photoelectric conversion apparatuses described in the individual embodiments are back-illuminated photoelectric conversion apparatuses which receive incident light from the second surface and in which the circuit board 21 is arranged on the first surface.

In the following, the sensor board 11 and the circuit board 21 will be described as chips obtained by dicing; however, the sensor board 11 and the circuit board 21 are not limited to such chips. For example, each board may be a wafer. The individual boards may be stacked one on top of the other in a wafer state and then be subjected to dicing. Alternatively, the individual boards may also be divided from a wafer state into chips, and chips may be staked one on top of the other and joined to each other.

A pixel region 12 is arranged on the sensor board 11, and a circuit region 22, which processes a signal detected by the pixel region 12, is arranged on the circuit board 21.

Figure 2:
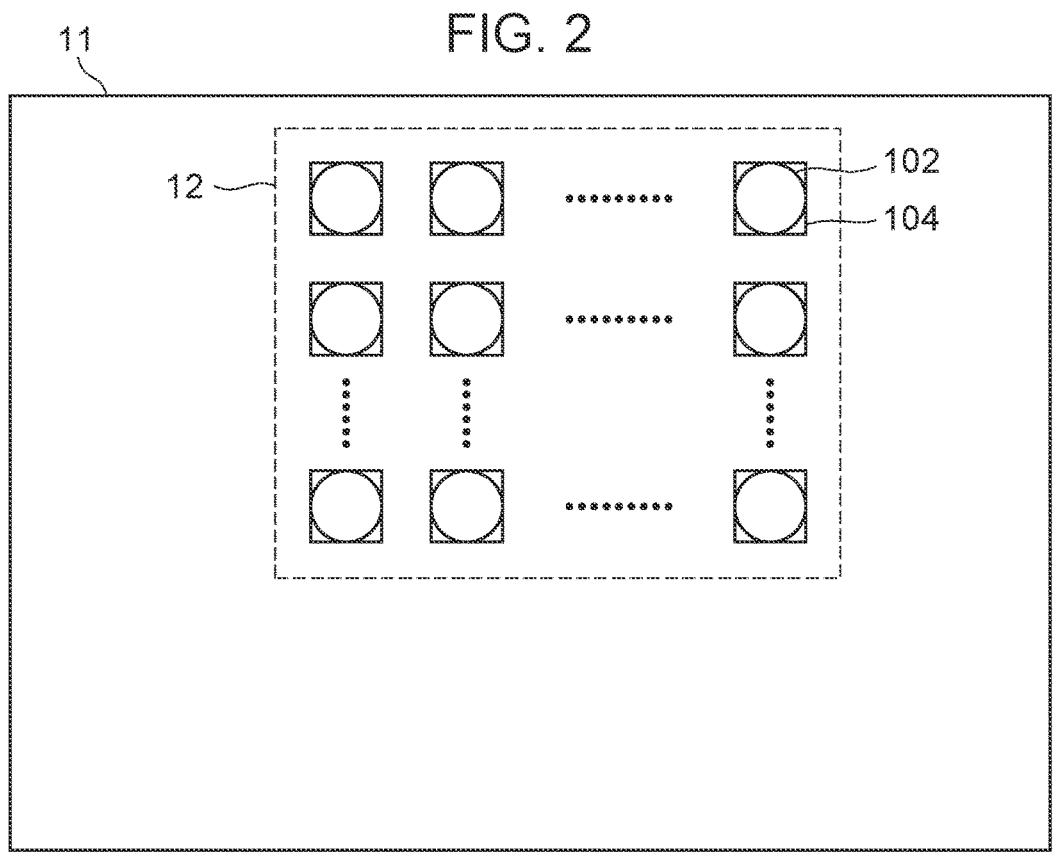
FIG. 2 illustrates an example of the arrangement of a sensor board.

FIG. 2 is a diagram illustrating an example of the arrangement of the sensor board 11. The pixel region 12 is formed by arranging, in a two-dimensional array in a plan view, pixels 104 having photoelectric conversion elements 102 including APDs.

Typically, the pixels 104 are pixels for forming an image; however, the pixels 104 do not have to form an image when used for time of flight (TOF). That is, the pixels 104 may also be used to measure the time of arrival of light and the amount of light.

Figure 3:
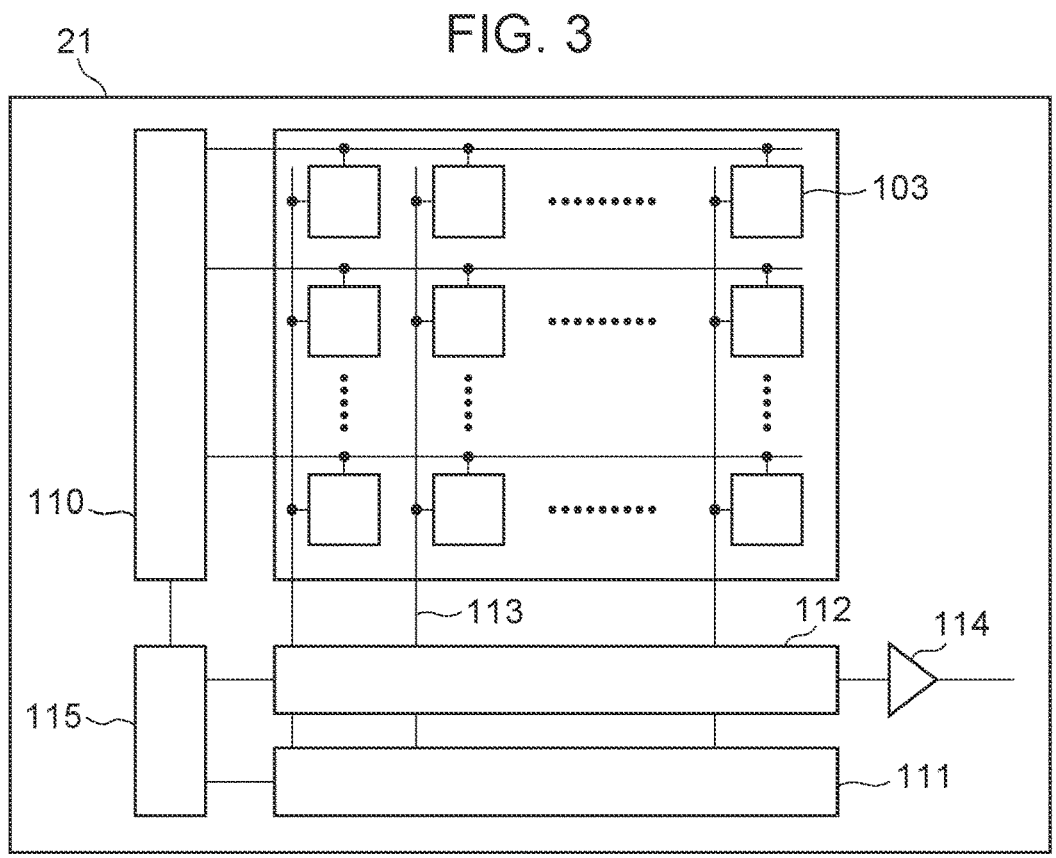
FIG. 3 illustrates an example of the arrangement of a circuit board.

FIG. 3 is a diagram of the configuration of the circuit board 21. The circuit board 21 has signal processing units 103, a read-out circuit 112, a control pulse generation unit 115, a horizontal scanning circuit unit 111, signal lines 113, and a vertical scanning circuit unit 110. The signal processing units 103 process electric charge obtained by photoelectric conversion performed by the photoelectric conversion elements 102 in FIG. 2.

The photoelectric conversion elements 102 in FIG. 2 are electrically connected to the signal processing units 103 in FIG. 3 via connection wiring lines provided on a pixel basis.

The vertical scanning circuit unit 110 receives a control pulse supplied from the control pulse generation unit 115 and supplies the control pulse to each pixel. In the vertical scanning circuit unit 110, a logic circuit such as a shift register or an address decoder is used.

In each pixel 104, a signal output from the photoelectric conversion element 102 is processed by the signal processing unit 103. The signal processing unit 103 is provided with a counter, a memory, and the like, and the memory holds a digital value.

To read out signals from the memories of the individual pixels in which digital signals are held, the horizontal scanning circuit unit 111 inputs, into the signal processing units 103, a control pulse for sequentially selecting columns.

Regarding a selected column, a signal is output from the signal processing unit 103 of the pixel selected by the vertical scanning circuit unit 110 to a corresponding one of the signal lines 113.

The signal output to the signal line 113 is output through an output circuit 114 to a recording unit or a signal processing unit outside the photoelectric conversion apparatus 100.

In FIG. 2, the photoelectric conversion elements 102 in the pixel region 12 may be arranged in a one-dimensional shape. Each of all the photoelectric conversion elements 102 does not need to have the function of the signal processing unit 103. For example, one signal processing unit 103 may be shared by a plurality of photoelectric conversion elements 102, and signal processing may be sequentially performed for the plurality of photoelectric conversion elements 102.

As illustrated in FIGS. 2 and 3, the signal processing units 103 are arranged in a region overlapping the pixel region 12 in a plan view. The vertical scanning circuit unit 110, the horizontal scanning circuit unit 111, the read-out circuit 112, the output circuit 114, and the control pulse generation unit 115 are arranged so as to overlap a region between the ends of the sensor board 11 and the ends of the pixel region 12 in a plan view. In other words, the sensor board 11 has the pixel region 12 and a non-pixel region surrounding the pixel region 12. The vertical scanning circuit unit 110, the horizontal scanning circuit unit 111, the read-out circuit 112, the output circuit 114, and the control pulse generation unit 115 are arranged in a region overlapping the non-pixel region in a plan view.

Figure 4:
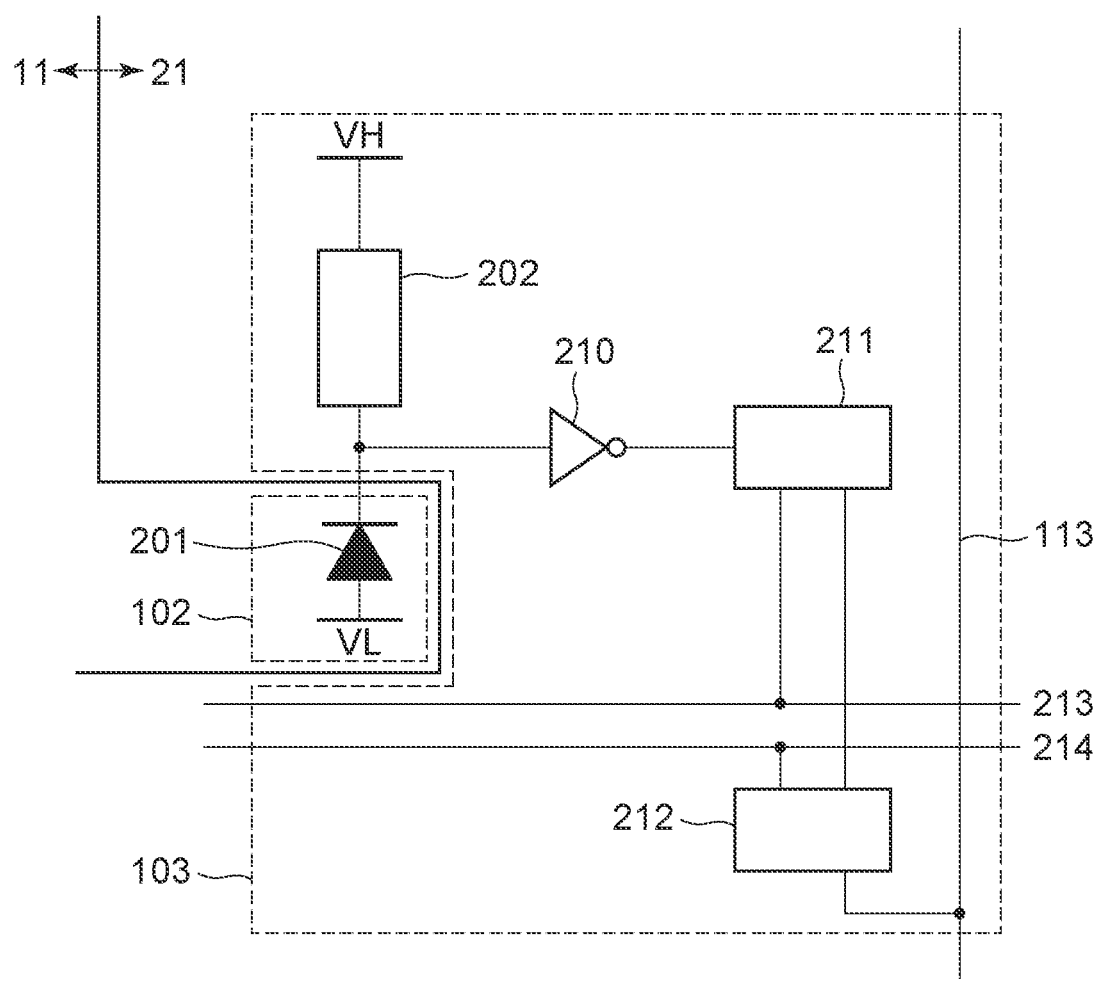
FIG. 4 is a block diagram including an equivalent circuit of a photoelectric conversion element.

FIG. 4 is an example of a block diagram including equivalent circuits of FIGS. 2 and 3.

In FIG. 4, the photoelectric conversion element 102 including an APD 201 is provided on the sensor board 11, and the other members are provided on the circuit board 21.

The APD 201 generates, through photoelectric conversion, a charge pair corresponding to incident light. A voltage VL (a first voltage) is supplied to the anode of the APD 201. A voltage VH (a second voltage) higher than the voltage VL, which is supplied to the anode, is supplied to the cathode of the APD 201. A reverse bias voltage is supplied to the anode and the cathode such that the APD 201 performs an avalanche multiplication operation. With such a voltage applied, electric charge generated by incident light causes avalanche multiplication, so that an avalanche current is generated.

Note that, in a case where a reverse bias voltage is supplied, a mode in which an APD is operated with the potential difference between the anode and the cathode greater than a breakdown voltage is referred to as Geiger mode. In contrast, a mode in which an APD is operated with the potential difference between the anode and the cathode near or less than or equal to the breakdown voltage is referred to as linear mode.

An APD operated in Geiger mode is called a single-photon avalanche diode (SPAD). For example, the voltage VL (the first voltage) is −30 V, and the voltage VH (the second voltage) is 1 V. The APD 201 may be operated in linear mode or in Geiger mode.

A quenching device 202 is connected to a power supply for supplying the voltage VH and the APD 201. The quenching device 202 functions as a load circuit (a quenching circuit) at the time of signal multiplication due to avalanche multiplication, reduces a voltage to be supplied to the APD 201, and helps to prevent avalanche multiplication (a quenching operation). In addition, the quenching device 202 functions to return the voltage to be supplied to the APD 201 back to the voltage VH by causing a current corresponding to a voltage drop caused by the quenching operation to flow (a recharge operation).

The signal processing unit 103 includes a waveform shaping unit 210, a counter circuit 211, and a selection circuit 212. Herein, it is sufficient that the signal processing unit 103 include any one out of the waveform shaping unit 210, the counter circuit 211, and the selection circuit 212.

The waveform shaping unit 210 shapes a change in the electric potential of the cathode of the APD 201 obtained when photons are detected, and outputs a pulse signal. As the waveform shaping unit 210, for example, an inverter circuit is used. In FIG. 4, an example is illustrated in which one inverter is used as the waveform shaping unit 210; however, a circuit in which a plurality of inverters are connected in series may be used or another circuit achieving a waveform shaping effect may be used.

The counter circuit 211 counts the number of pulse signals output from the waveform shaping unit 210 and holds a count value. When a control pulse pRES is supplied via a drive line 213, the signal held by the counter circuit 211 is reset.

A control pulse pSEL is supplied to the selection circuit 212 from the vertical scanning circuit unit 110 illustrated in FIG. 3 via a drive line 214 illustrated in FIG. 4 (not illustrated in FIG. 3), and electrical connection and disconnection between the counter circuit 211 and the signal line 113 are switched. The selection circuit 212 includes, for example, a buffer circuit for outputting a signal.

Electrical connection may be switched by arranging a switch such as a transistor between the quenching device 202 and the APD 201 or between the photoelectric conversion element 102 and the signal processing unit 103. Similarly, supply of the voltage VH or voltage VL to be supplied to the photoelectric conversion element 102 may be electrically switched using a switch such as a transistor.

In the present embodiment, a configuration using the counter circuit 211 is illustrated. However, the photoelectric conversion apparatus 100 may acquire a pulse detection timing using a time-to-digital converter (hereinafter referred to as TDC) and a memory instead of the counter circuit 211. In this case, the timing of occurrence of a pulse signal output from the waveform shaping unit 210 is converted into a digital signal by the TDC. To measure a timing of a pulse signal, a control pulse pREF (a reference signal) is supplied to the TDC from the vertical scanning circuit unit 110 illustrated in FIG. 3 via a drive line. The TDC acquires, as a digital signal, a signal obtained when the timing of input of a signal output from each pixel via the waveform shaping unit 210 is treated as a relative time with respect to the control pulse pREF.

Figure 5A:
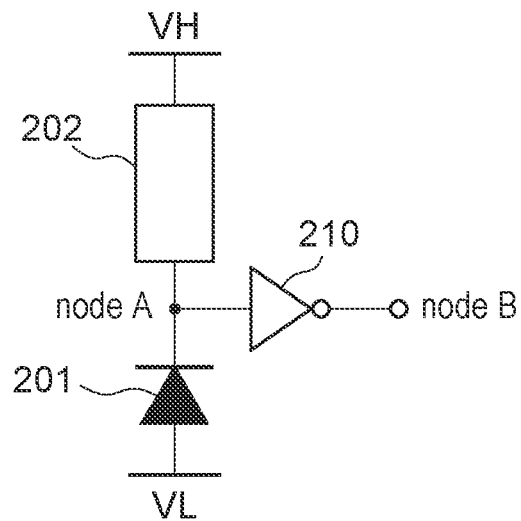
FIGS. 5A to 5C are diagrams illustrating relationships between an operation of an APD and output signals.
Figure 5B:
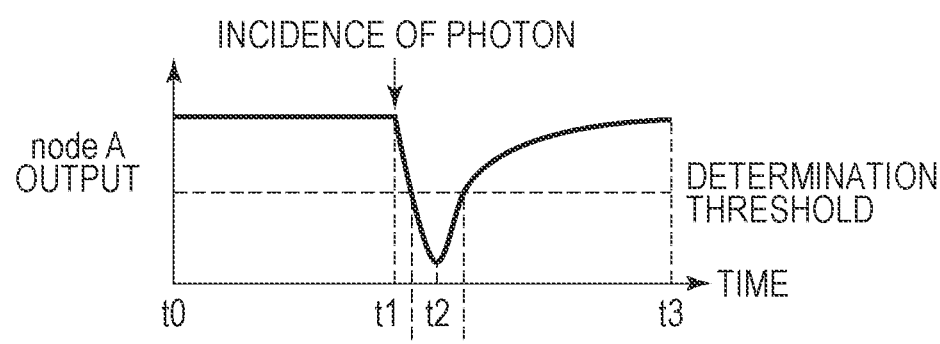
Figure 5C:
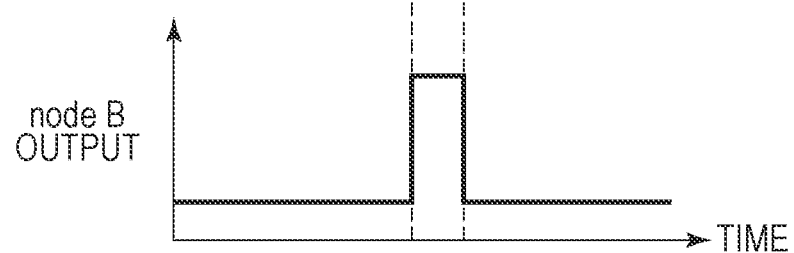

FIGS. 5A to 5C are diagrams schematically illustrating relationships between an operation of the APD and output signals.

FIG. 5A is a diagram illustrating the APD 201, the quenching device 202, and the waveform shaping unit 210 extracted from FIG. 4. In this case, the input side of the waveform shaping unit 210 is a node A, and the output side of the waveform shaping unit 210 is a node B. FIG. 5B illustrates changes in waveform at the node A in FIG. 5A, and FIG. 5C illustrates changes in waveform at the node B in FIG. 5A.

During the period from a time t0 to a time t1, a potential difference of VH−VL is applied to the APD 201 in FIG. 5A. When photons are incident on the APD 201 at the time t1, avalanche multiplication occurs in the APD 201, an avalanche multiplication current flows through the quenching device 202, and the voltage at the node A drops. When the amount of voltage drop further increases, and the potential difference applied to the APD 201 decreases, the avalanche multiplication in the APD 201 stops as indicated at a time t2, and the voltage level at the node A does not fall below a certain value. Thereafter, a current for compensating the amount of voltage drop flows through the node A from the voltage VL during the period from the time t2 to a time t3, and the potential level at the node A becomes stable at its original potential level at the time t3. In this case, part of the output waveform exceeding a certain threshold at the node A is shaped by the waveform shaping unit 210 and is output as a signal from the node B.

Note that the arrangement of the signal lines 113, the read-out circuit 112, and the output circuit 114 is not limited to the arrangement illustrated in FIG. 3. For example, the signal lines 113 may be arranged so as to extend in the row direction, and the read-out circuit 112 may be arranged at a position beyond the signal lines 113 and in the direction in which the signal lines 113 extend.

In the following, photoelectric conversion apparatuses according to the individual embodiments will be described.

First Embodiment

A photoelectric conversion apparatus according to a first embodiment will be described with reference to FIGS. 6 to 8.

Figure 6:
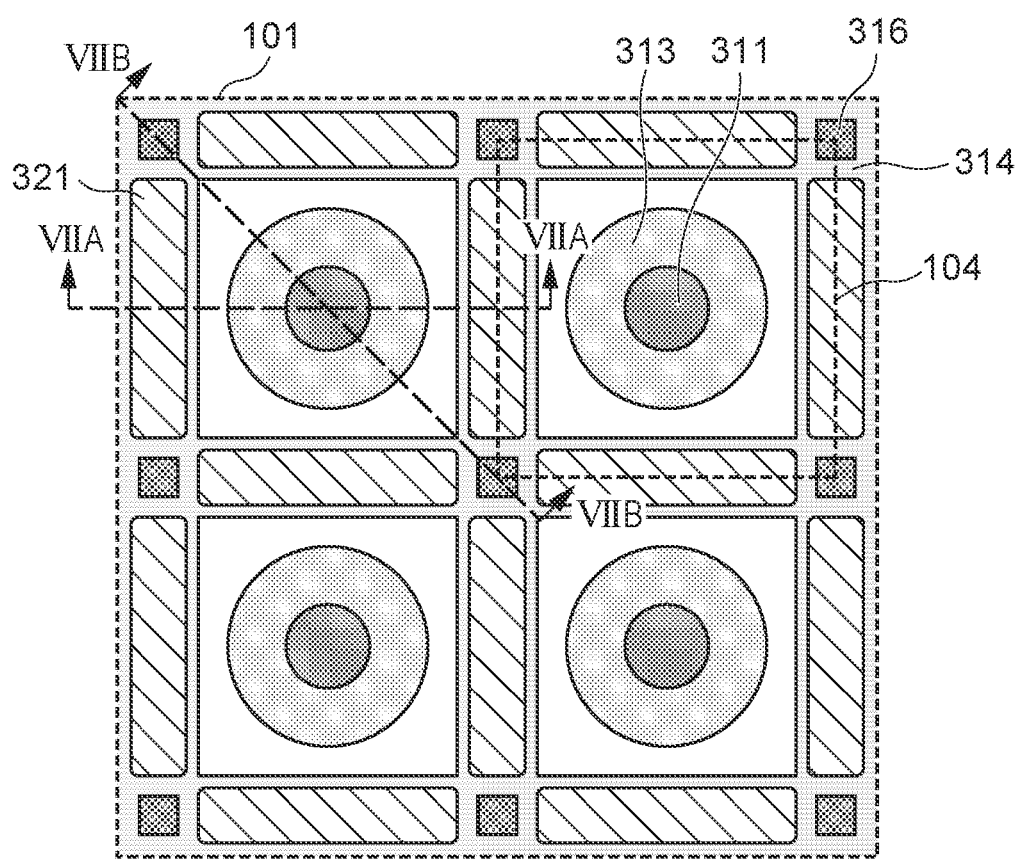
FIG. 6 is a schematic plan view of a photoelectric conversion apparatus according to a first embodiment.
Figure 7A:
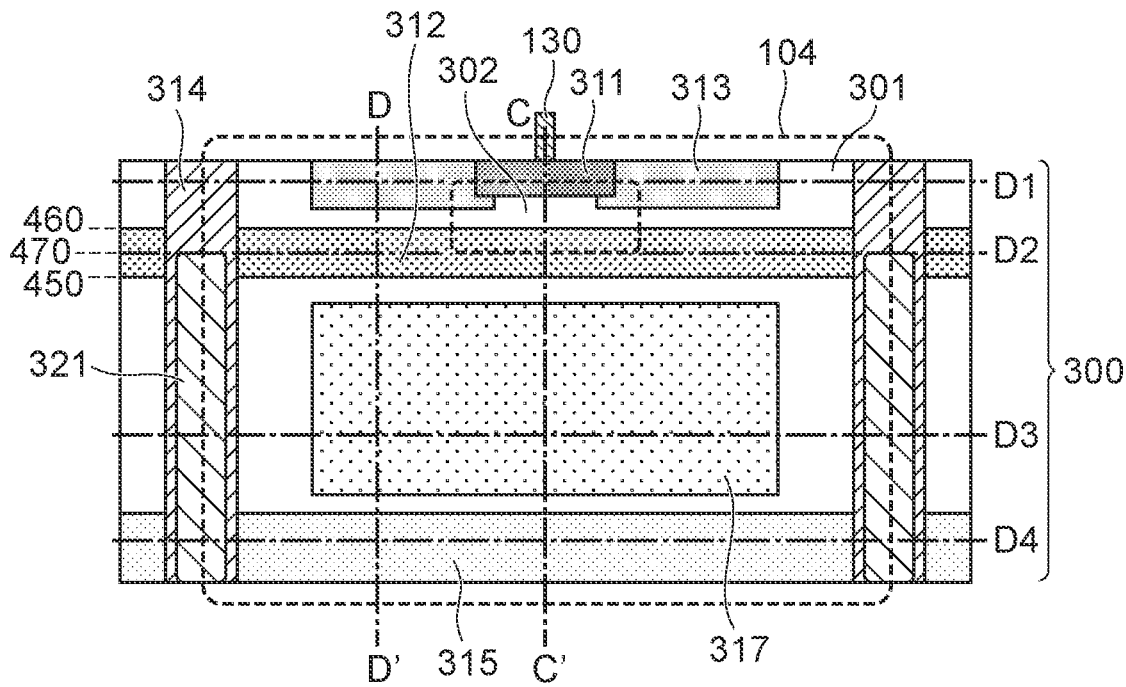
FIGS. 7A and 7B are schematic cross-section diagrams of the photoelectric conversion apparatus according to the first embodiment.

FIG. 6 is a schematic plan view of four (2×2) pixels among a plurality of pixels included in the pixel region 12. FIG. 6 illustrates a plane of the semiconductor layer 300. Note that FIG. 6 is a schematic diagram, and certain members may be illustrated in a see-through manner. Specifically, as illustrated in FIG. 7A to be described in the following, trench structures 321 are not exposed from the first surface of the semiconductor layer 300, and a fourth semiconductor region 314 is exposed from the first surface. However, in FIG. 6, some members are illustrated in a see-through state to emphasize the positions of the trench structures 321.

Figure 7B:
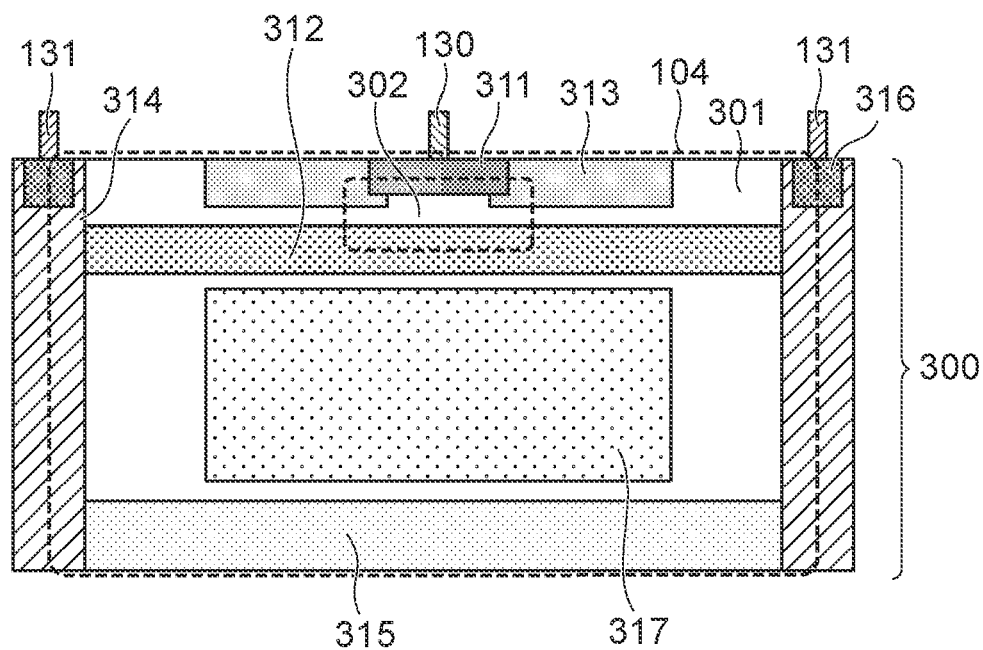

FIG. 7A is a schematic cross-section diagram taken along line VIIA-VIIA of FIG. 6, that is, in a first direction. FIG. 7B is a schematic cross-section diagram taken along line VIIB-VIIB of FIG. 6, that is, in a second direction crossing the first direction. In FIGS. 7A and 7B, the first direction is orthogonal to the second direction. In FIGS. 7A and 7B, the first direction is a direction in which one side of a first APD and one side of a second APD face each other (hereinafter referred to as "side facing direction"), and the second direction is a diagonal direction.

As illustrated in FIG. 6, each pixel 104 includes at least one APD. Note that, in the following description, embodiments will be described in which each pixel 104 includes one APD; however, the pixel 104 may include a plurality of APDs. In the following, for the sake of convenience, an APD that is aligned with a first APD in the side facing direction is referred to as a second APD, and an APD that is aligned with the first APD in the diagonal direction is referred to as a third APD.

Although details of each semiconductor region will be described later, in FIG. 6, a first-conductivity-type (for example, N-type) first semiconductor region 311 for forming an avalanche multiplication region of an APD is illustrated in each pixel 104. A third semiconductor region 313 is arranged around the first semiconductor region 311.

In FIG. 6, a second-conductivity-type (for example, P-type) sixth semiconductor region 316, to which a contact plug is connected, is arranged between the first semiconductor region 311 of the first APD and the first semiconductor region 311 of the third APD.

A separator including the fourth semiconductor region 314 of the second conductivity type is arranged between the pixels. The fourth semiconductor region 314 of the second conductivity type is arranged so as to separate, from each other, the APDs arranged in the side facing direction and the diagonal direction. In a plan view, the sixth semiconductor region 316 is arranged so as to overlap the fourth semiconductor region 314. Moreover, the trench structures 321 are provided between the pixels so as to separate, from each other, the pixels arranged in the side facing direction.

In one embodiment, the trench structures 321 include a material different from that included in the semiconductor layer 300. In another embodiment, the trench structures 321 include a reflective material or a light absorption material. The reflective material or the light absorption material is, for example, a material that reflects or absorbs at least 20% of light. For example, the trench structures 321 include at least one out of an insulation member, air, and metal. In a case where the semiconductor layer 300 is silicon, examples of the insulation member include a silicon oxide film and a silicon nitride film. As a result, crosstalk between adjacent APDs can be reduced. In yet another embodiment, the trench structures 321 include at least one out of the insulation member and metal. In an avalanche multiplication region 302, a phenomenon called avalanche emission may occur. This is a phenomenon in which a photon occurs by recombining an electron, which is a hot carrier generated by avalanche multiplication, with a hole. When this photon due to avalanche emission leaks into an adjacent pixel and is photoelectrically converted, an electron-hole pair is generated. That is, a photon due not to incident light but to avalanche emission is read out as a signal from an adjacent pixel, and this signal is a pseudo signal. Since the trench structures 321 include a light shielding member such as metal, this helps to prevent a photon from entering an adjacent pixel even in a case where avalanche emission occurs.

Note that, in the following description, embodiments will be described in which each pixel 104 includes one APD; however, the pixel 104 may include a plurality of APDs.

As illustrated in FIG. 7A, the individual semiconductor regions constituting the pixel 104 are arranged in the semiconductor layer 300. The APD includes at least the first semiconductor region 311 of the first conductivity type and a second semiconductor region 312 of the second conductivity type. The first semiconductor region 311 and the second semiconductor region 312 form a PN junction. The impurity concentration of the first semiconductor region 311 is higher than the impurity concentration of the second semiconductor region 312. The avalanche multiplication region 302 is formed by applying a predetermined reverse bias voltage to the first semiconductor region 311 and the second semiconductor region 312. The first semiconductor region 311 is connected to a contact plug 130, and a voltage is applied to the first semiconductor region 311 via the contact plug 130. Note that a plurality of contact plugs 130 may be arranged.

A semiconductor region 301 of the first conductivity type may be arranged between the first semiconductor region 311 and the second semiconductor region 312, the semiconductor region 301 having a lower impurity concentration than the first semiconductor region 311. The semiconductor region 301 may be of the first conductivity type or the second conductivity type.

The third semiconductor region 313 of the first conductivity type is arranged for electric field relaxation at the end portion of the first semiconductor region 311. The third semiconductor region 313 may be formed by a second-conductivity-type semiconductor region as long as electric field relaxation can be achieved. The impurity concentration of the third semiconductor region 313 is lower than that of the first semiconductor region 311 in a case where the third semiconductor region 313 is of the first conductivity type, and is lower than that of the second semiconductor region 312 in a case where the third semiconductor region 313 is of the second conductivity type. The impurity concentration of the third semiconductor region 313 is, at most, half that of the first semiconductor region 311 or the second semiconductor region 312. The third semiconductor region 313 is an additional semiconductor region, and thus the third semiconductor region 313 does not have to be provided.

In FIGS. 7A and 7B, the fourth semiconductor region 314 of the second conductivity type is arranged so as to separate, from each other, the pixels arranged in the side facing direction and the diagonal direction. The second semiconductor region 312 of the second conductivity type is arranged so as to be in contact with the fourth semiconductor region 314. A fifth semiconductor region 315 of the second conductivity type is arranged so as to be in contact with the fourth semiconductor region 314.

The fifth semiconductor region 315 of the second conductivity type is arranged at a position deeper than the second semiconductor region 312. The fifth semiconductor region 315 of the second conductivity type is arranged so as to be in contact with the fourth semiconductor region 314. In a plan view, the fifth semiconductor region 315 may be arranged so as to cover the entire plane of the pixel 104, and part of the fifth semiconductor region 315 may overlap the fourth semiconductor region 314. In FIGS. 7A and 7B, the fifth semiconductor region 315 is arranged so as to be in contact with the back surface of the semiconductor layer 300; however, the fifth semiconductor region 315 may be arranged so as to be apart from the back surface of the semiconductor layer 300.

Note that, in FIGS. 7A and 7B, an example is illustrated in which the fifth semiconductor region 315 of the second conductivity type is formed by ion implantation; however, the fifth semiconductor region 315 does not have to be a semiconductor layer formed by ion implantation. For example, an example is also possible in which a pinning film is arranged on the back surface of the semiconductor layer 300 and in which the fifth semiconductor region 315 is not formed by ion implantation. As the pinning film, a known material can be used.

Note that, although not illustrated, for example, a planarization layer, a filter layer, and a microlens may also be arranged on the back surface of the semiconductor layer 300. In the filter layer, various optical filters such as a color filter, an infrared light cut filter, or a monochrome filter may be used. As the color filter, an RGB color filter, an RGBW color filter, or the like can be used.

A seventh semiconductor region 317 of the first conductivity type is provided between the second semiconductor region 312 and the fifth semiconductor region 315. The impurity concentration of the seventh semiconductor region 317 is higher than the impurity concentration of the semiconductor region 301 provided around the seventh semiconductor region 317. With this configuration, for signal charge, the potential of the seventh semiconductor region 317 becomes lower than the potential of the semiconductor region 301, and it becomes possible to collect a greater number of electric charges into the avalanche multiplication region 302. The seventh semiconductor region 317 is a semiconductor region provided as needed and does not have to be provided. In the cross-section diagrams in FIGS. 7A and 7B, the seventh semiconductor region 317 is provided so as to be spaced apart from the second semiconductor region 312; however, part of the seventh semiconductor region 317 may be in contact with the second semiconductor region 312.

In FIG. 7A, the trench structures 321 are arranged from the back surface side of the semiconductor layer 300. The trench structures 321 are provided so as to be contained in the fourth semiconductor region 314. That is, in the side facing direction, the pixels are separated from each other by both of the trench structures 321 and the fourth semiconductor region 314 of the second conductivity type.

In contrast, with reference to FIG. 7B, in the diagonal direction, the trench structures 321 are not provided, and the pixels are separated from each other by the fourth semiconductor region 314. Since the trench structures 321 are not arranged between the pixels in the diagonal direction, the electrical resistance from a contact plug 131 to the fifth semiconductor region 315 can be reduced. As a result, it becomes easier to form a potential gradient in a direction perpendicular to the semiconductor layer 300, and the amount of time needed to collect signal charge into the avalanche multiplication region 302 can be reduced.

The fourth semiconductor region 314 of the second conductivity type on the front surface side of the semiconductor layer 300 is provided with the sixth semiconductor region 316 of the second conductivity type. The impurity concentration of the sixth semiconductor region 316 is higher than the impurity concentration of the fourth semiconductor region 314. With this configuration, by connecting the sixth semiconductor region 316 to the contact plug 131, the contact resistance between metal and semiconductor can be made lower than the contact resistance for the case where the fourth semiconductor region 314 is connected to the contact plug 131.

By applying a certain reverse bias voltage between the contact plug 131 connected to the sixth semiconductor region 316 and the contact plug 130 connected to the first semiconductor region 311, the avalanche multiplication region 302 can be formed.

Note that, in the above description, an example has been illustrated in which contact plugs 131 are arranged between the pixels in the diagonal direction and are not arranged between the pixels in the side facing direction. However, it is sufficient that the contact plugs 131 be configured to be able to supply an electric potential to the second semiconductor regions 312, and thus the contact plugs 131 may also be arranged between the pixels in the side facing direction. In this case, the top surface of the fourth semiconductor region 314 illustrated in FIG. 7A is connected to contact plugs. Moreover, a semiconductor region of the second conductivity type having a higher impurity concentration than the fourth semiconductor region 314 may be provided between the fourth semiconductor region 314 and the contact plugs, and the semiconductor region may be connected to the contact plugs.

(Summary of Semiconductor Regions at Respective Positions and Potential Relationship)

At a first depth D1, the first semiconductor region 311 of the first conductivity type, the third semiconductor region 313 of the first or second conductivity type, the semiconductor region 301 of the first or second conductivity type, the fourth semiconductor region 314 of the second conductivity type, and the sixth semiconductor region 316 of the second conductivity type are arranged.

The first semiconductor region 311 and the third semiconductor region 313 are in contact with each other in a plan view. Moreover, the third semiconductor region 313 and the semiconductor region 301 are in contact with each other in a plan view.

In this case, arrangement of each semiconductor region at the first depth D1 refers to, for example, arrangement of a peak of ion-implanted impurity concentration at the first depth D1. However, the peak does not always have to be arranged at the first depth D1, and it is sufficient that a region be provided where it is possible to recognize that impurities are diffused.

A second depth D2 is a position deeper than the first depth D1. In other words, the second depth D2 is a position closer to the back surface of the semiconductor layer 300 than the first depth D1 is. The second semiconductor region 312 and the fourth semiconductor region 314 are arranged at the second depth D2.

A third depth D3 is a position deeper than the second depth D2. In other words, the third depth D3 is a position closer to the back surface of the semiconductor layer 300 than the second depth D2 is. The seventh semiconductor region 317, the semiconductor region 301, the trench structures 321, and the fourth semiconductor region 314 are arranged at the third depth D3.

A fourth depth D4 is a position deeper than the third depth D3. In other words, the fourth depth D4 is a position closer to the back surface of the semiconductor layer 300 than the third depth D3 is. The fifth semiconductor region 315, the trench structures 321, and the fourth semiconductor region 314 are arranged at the fourth depth D4.

Figure 8:
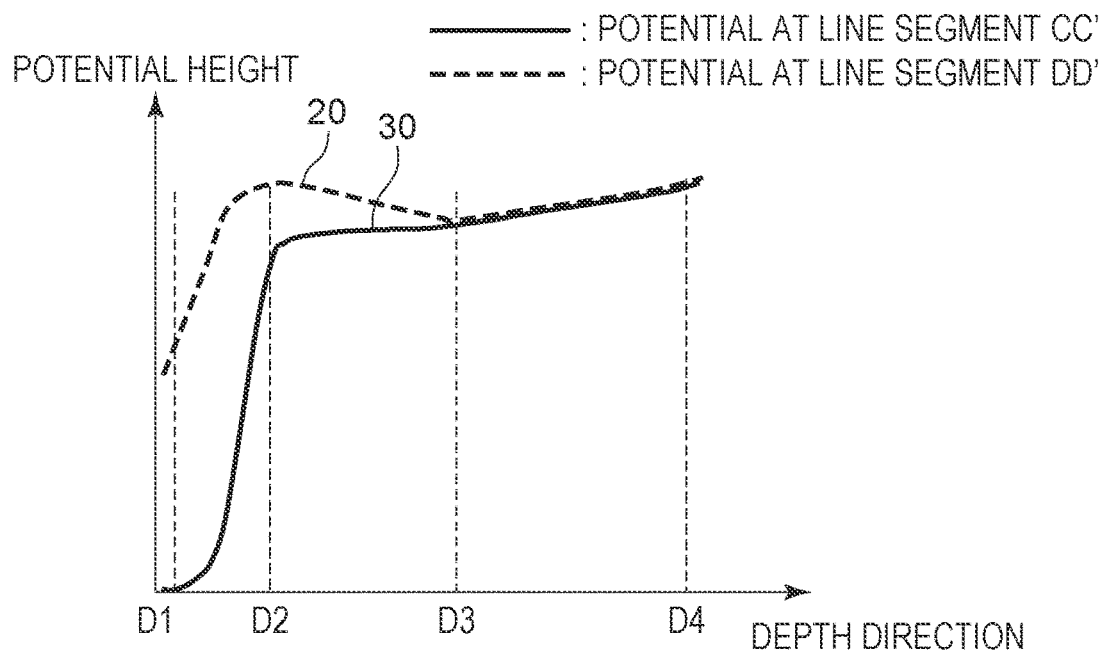
FIG. 8 is a potential diagram of a pixel of the photoelectric conversion apparatus according to the first embodiment.

FIG. 8 illustrates a potential diagram of the APD illustrated in FIGS. 6, 7A, and 7B.

In FIG. 8, a dotted line 20 illustrates a potential distribution at a line segment DD', and a solid line 30 illustrates a potential distribution at a line segment CC'. In FIG. 8, D1 to D4 of the horizontal axis corresponding to the depth direction correspond to D1 to D4 in FIG. 7A, respectively.

Regarding the dotted line 20 in FIG. 8, potential gradually decreases from the depth D4 toward the depth D3. The seventh semiconductor region 317 arranged at the depth D3 is of the first conductivity type, and the second semiconductor region 312 arranged at the depth D2 is of the second conductivity type. Thus, potential gradually increases from the depth D3 toward the depth D2. In contrast, the third semiconductor region 313 arranged at the depth D1 is of the first conductivity type or of the second conductivity type having a lower impurity concentration than the second semiconductor region 312. Thus, potential gradually decreases from the depth D2 toward the depth D1.

In contrast, regarding the solid line 30, potential gradually decreases from the depth D4 toward the depth D3. This exhibits the solid line 30 having the same tendency as the dotted line 20. However, regarding the solid line 30, potential gradually decreases from the depth D3 toward the depth D2. In addition, potential steeply decreases from the depth D2 toward the depth D1. From the depth D4 to D3, the potential gradient represented by the dotted line 20 and that represented by the solid line 30 have almost the same tendency, and the potential gradients slowly decrease. Thus, electric charge generated at a photodetector moves toward the front surface (the first surface) of the semiconductor layer 300 in accordance with the gently sloping potential gradients.

In this case, as described above, the first semiconductor region 311 and the second semiconductor region 312 form a PN junction, and the impurity concentration of the second semiconductor region 312 is lower than that of the first semiconductor region 311. Thus, when a reverse bias potential is supplied to the first semiconductor region 311 and the second semiconductor region 312, a depletion region is formed on the second semiconductor region 312 side. In this case, a strong electric field is applied to a center area of the second semiconductor region 312 around the avalanche multiplication region 302, whereas only a small electric field is applied to a peripheral area within the second semiconductor region 312. Thus, the potential represented by the solid line 30 is greatly reduced at the position represented by the depth D2, and the potential represented by the solid line 30 is lower than the potential represented by the dotted line 20 at the depth D2. In contrast, since only a small electric field is applied to the peripheral area within the second semiconductor region 312, a potential relationship is maintained that corresponds to differences between the conductivity types of the individual semiconductor regions or differences between the impurity concentrations of the individual semiconductor regions.

With such a configuration, as represented by the dotted line 20 and the solid line 30 at the depth D2 in FIG. 8, a potential height for electrons servings as signal charge is lower at the center area of the second semiconductor region 312 than at the peripheral area within the second semiconductor region 312. As a result, electric charge obtained by photoelectric conversion is likely to move in the direction to the center area of the second semiconductor region 312.

Electric charge having moved to near the center area of the second semiconductor region 312 is accelerated in accordance with the steep potential gradient of the solid line 30 from the depth D2 to the depth D1 in FIG. 8, so that avalanche multiplication occurs in the avalanche multiplication region 302.

In contrast to this, the dotted line 20 from the depth D2 to the depth D1 in FIG. 8 represents a potential distribution that does not cause avalanche multiplication. Thus, without increasing the area of the avalanche multiplication region 302 with respect to a pixel size, generated electric charges can be counted as signal charge.

In the following, an example of the impurity concentration of each semiconductor region will be specifically described. In this case, the first conductivity type corresponds to N-type, and the second conductivity type corresponds to P-type.

In FIG. 7B, the impurity concentration of the sixth semiconductor region 316 is about $1 \times 10^{19}$ to $10^{20}$ atoms/cm$^3$.

The N-type first semiconductor region 311 has a higher impurity concentration than the N-type seventh semiconductor region 317. For example, the impurity concentration of the N-type first semiconductor region 311 is greater than or equal to $1 \times 10^{18}$ atoms/cm$^3$, and a reverse bias potential with respect to the fourth semiconductor region 314 is supplied to the N-type first semiconductor region 311.

The N-type third semiconductor region 313 has a lower impurity concentration than the N-type first semiconductor region 311. For example, the impurity concentration of the N-type third semiconductor region 313 is about $1\times10^{16}$ to $5\times10^{17}$ atoms/cm$^3$. Hypothetically, in a case where the third semiconductor region 313 is of P-type, an electric field for avalanche multiplication is formed between the first semiconductor region 311 and the third semiconductor region 313 depending on the impurity concentration of the third semiconductor region 313, and this may cause a noise deterioration.

The impurity concentration of the P-type second semiconductor region 312 is made lower than that of the P-type fourth semiconductor region 314. For example, the impurity concentration of the P-type second semiconductor region 312 is about $1\times10^{16}$ to $5\times10^{17}$ atoms/cm$^3$.

Incidentally, in FIGS. 7A and 7B, suppose that the N-type seventh semiconductor region 317 having a lower impurity concentration than the N-type first semiconductor region 311 is arranged directly below the N-type first semiconductor region 311 without provision of the P-type second semiconductor region 312. In this case, it is possible to generate electric charge in the seventh semiconductor region 317 and read out the electric charge from the N-type first semiconductor region 311.

However, it is difficult to cause avalanche multiplication under substantially the same voltage condition as in the present embodiment. This is because a potential difference applied to an avalanche multiplication region near the N-type first semiconductor region 311 becomes small due to most of a reverse bias potential difference being applied to the depletion region of the N-type seventh semiconductor region 317. In contrast, in the present embodiment, the N-type seventh semiconductor region 317 is surrounded by a P-type semiconductor region in every direction, and thus the potential of the N-type seventh semiconductor region 317 reaches a level closer to that of the surrounding P-type semiconductor region than to that of the N-type first semiconductor region 311. That is, the P-type second semiconductor region 312 helps to prevent the depletion layer from excessively expanding toward the deep portion of the semiconductor layer 300, so that most of the above-described potential difference to be applied can be applied to the avalanche multiplication region near the N-type first semiconductor region 311 in a focused manner. As a result, avalanche multiplication of photoelectric charge can be caused at lower voltage. In this case, the impurity concentration of the N-type seventh semiconductor region 317 is to be lower than that of the N-type first semiconductor region 311.

In FIGS. 7A and 7B, the N-type seventh semiconductor region 317 is illustrated as a region having a uniform impurity concentration as one example. However, in one embodiment, the N-type seventh semiconductor region 317 has an impurity concentration gradient with which a potential structure is formed such that electric charge moves toward the first surface of the semiconductor layer 300. With such an impurity concentration gradient, it can be made easier for electric charge to move to the N-type seventh semiconductor region 317.

Moreover, in FIGS. 7A and 7B, the P-type second semiconductor region 312 is illustrated as an impurity region having a uniform impurity concentration. However, any configuration can be used with which the potential at the center area of the second semiconductor region 312 is made lower than the potential at the peripheral area within the second semiconductor region 312. For example, a configuration may be used with which the impurity concentration of the center area of the P-type second semiconductor region 312 is made higher than the impurity concentration of the peripheral area within the second semiconductor region 312. Furthermore, the center area of the second semiconductor region 312 may be an N-type semiconductor region.

The thickness of the semiconductor layer 300 can be set as appropriate in accordance with the wavelength of light to be detected. The color of light that the photoelectric conversion apparatus detects can be, for example, blue, green, red, or infrared light and can be set in accordance with an objective. The peak wavelength of light that the photoelectric conversion apparatus detects can be set, for example, within a range from 350 nm to 1000 nm.

In FIG. 7A, a position 470 where the top surfaces of the trench structures 321 are provided is between a position 460 where the top surface of the second semiconductor region 312 is provided and a position 450 where the bottom surface of the second semiconductor region 312 is provided.

As described above, the trench structures 321 are provided to reduce crosstalk between adjacent APDs. In this case, crosstalk includes not only crosstalk due to incident light but also crosstalk due to avalanche emission. Thus, to reduce crosstalk, the top surfaces of the trench structures 321 (corresponding to the "bottom surfaces" at the time when the trench structures 321 are formed) should be provided so as to reach the top surface of the semiconductor layer 300. Alternatively, the trench structures 321 should be provided such that the top surfaces of the trench structure 321 are arranged at a position between the top surface of the second semiconductor region 312 and the top surface of the semiconductor layer 300.

However, when the top surfaces of the trench structure 321 are provided near the top surface of the semiconductor layer 300 in this manner, a potential supplied from the contact plugs 131 to the second semiconductor region 312 may be insufficient due to the effect of the trench structures 321. As a result, a reverse bias voltage necessary for avalanche multiplication becomes high, and power consumption may be increased.

Thus, in the present embodiment, the trench structures 321 have a configuration in which the top surfaces of the trench structures 321 are positioned between the top and bottom surfaces of the second semiconductor region 312. As a result, a reduction in crosstalk can be achieved, an electric potential can be appropriately supplied to the second semiconductor region 312, and power consumption can also be reduced. Moreover, stable avalanche efficiency can be achieved, and a reduction in sensitivity can be reduced.

Modification of First Embodiment

In the above-described first embodiment, the example is described in which the trench structures 321 are provided in the side facing direction but not in the diagonal direction. However, the photoelectric conversion apparatus may have a configuration in which a trench structure 321 is provided in both of the side facing direction and the diagonal direction.

Figure 9:
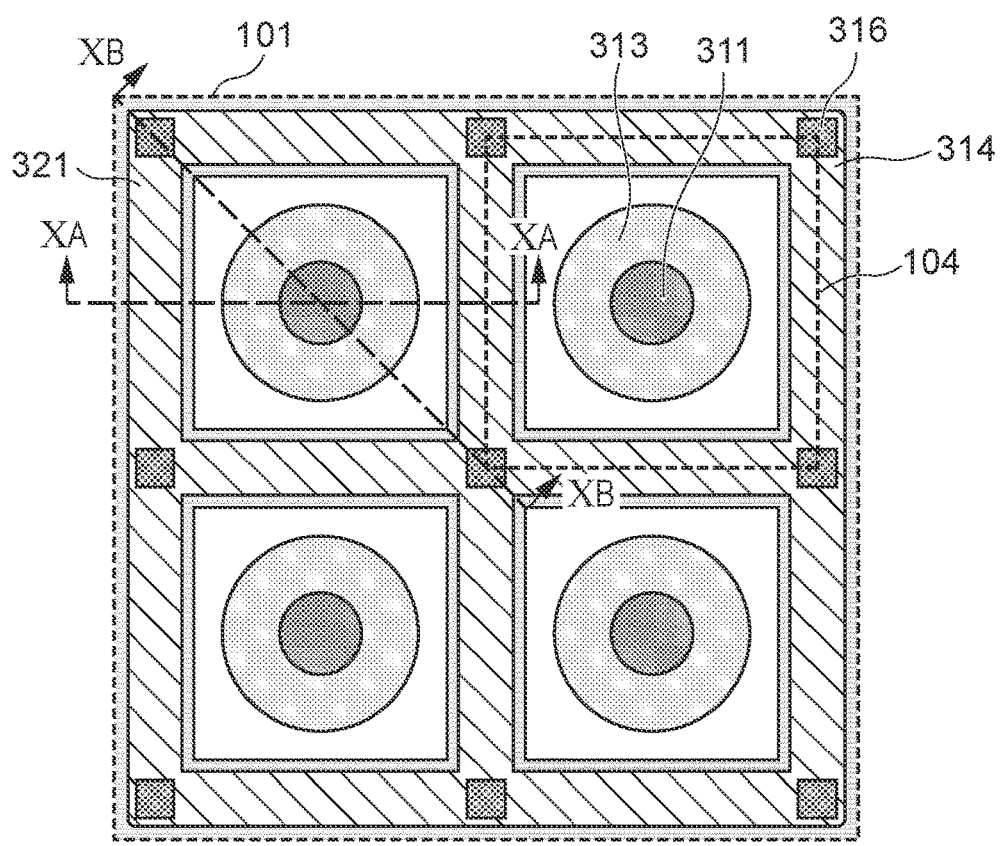
FIG. 9 is a schematic plan view of a photoelectric conversion apparatus according to a modification of the first embodiment.

Specifically, FIG. 9 is a plan view regarding four (2×2) pixels on the first surface of the semiconductor layer 300. In FIG. 9, a trench structure 321 is arranged also at positions overlapping the sixth semiconductor regions 316.

Figure 10A:
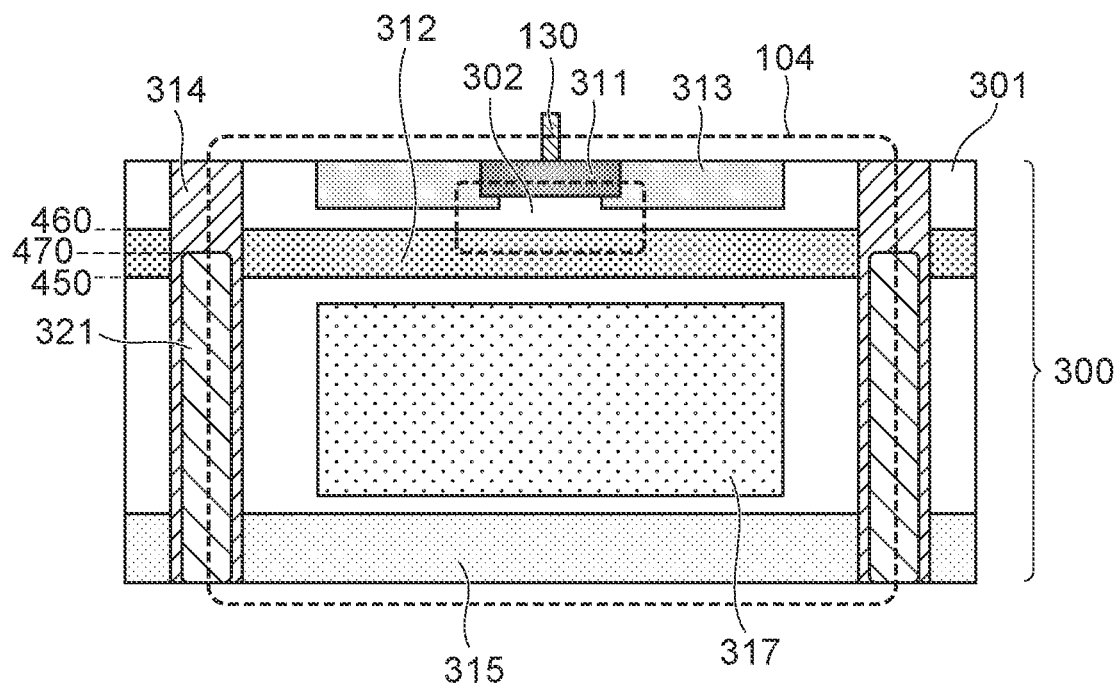
FIGS. 10A and 10B are schematic cross-section diagrams of the photoelectric conversion apparatus according to the modification of the first embodiment.
Figure 10B:
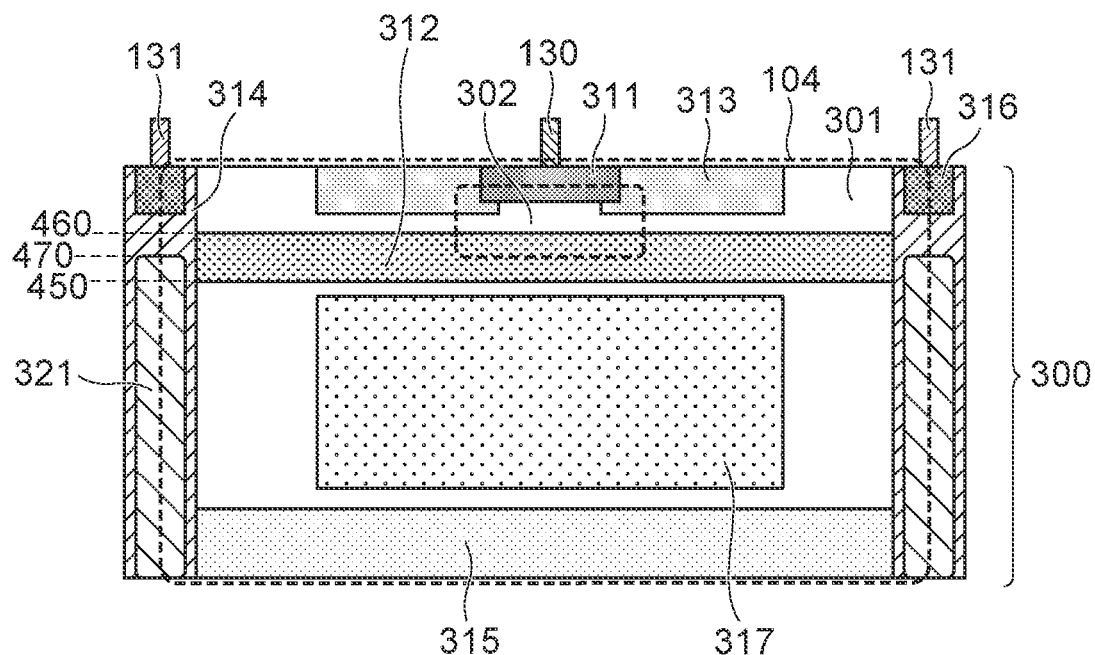

FIG. 10A is a schematic cross-section diagram taken along line XA-XA of FIG. 9, that is, in the side facing direction. FIG. 10B is a schematic cross-section diagram taken along line XB-XB of FIG. 9, that is, in the diagonal direction. As illustrated in FIG. 10B, the trench structure 321 is also arranged in the diagonal direction. Even in FIG. 10B, the top surface of the trench structure 321 is positioned between the position 460 of the top surface of the second semiconductor region 312 and the position 450 of the bottom surface of the second semiconductor region 312. As a result, an electric potential can be appropriately supplied to the second semiconductor region 312, and power consumption can be reduced. By arranging the trench structure 321 also in the diagonal direction, crosstalk between pixels provided in the diagonal direction can be more greatly reduced.

Second Embodiment

A photoelectric conversion apparatus according to a second embodiment will be described with reference to FIGS. 11 to 12B. The second embodiment differs from the first embodiment in that the top surface of the fourth semiconductor region 314 of the second conductivity type in the side facing direction does not reach the first surface of the semiconductor layer 300.

Figure 11:
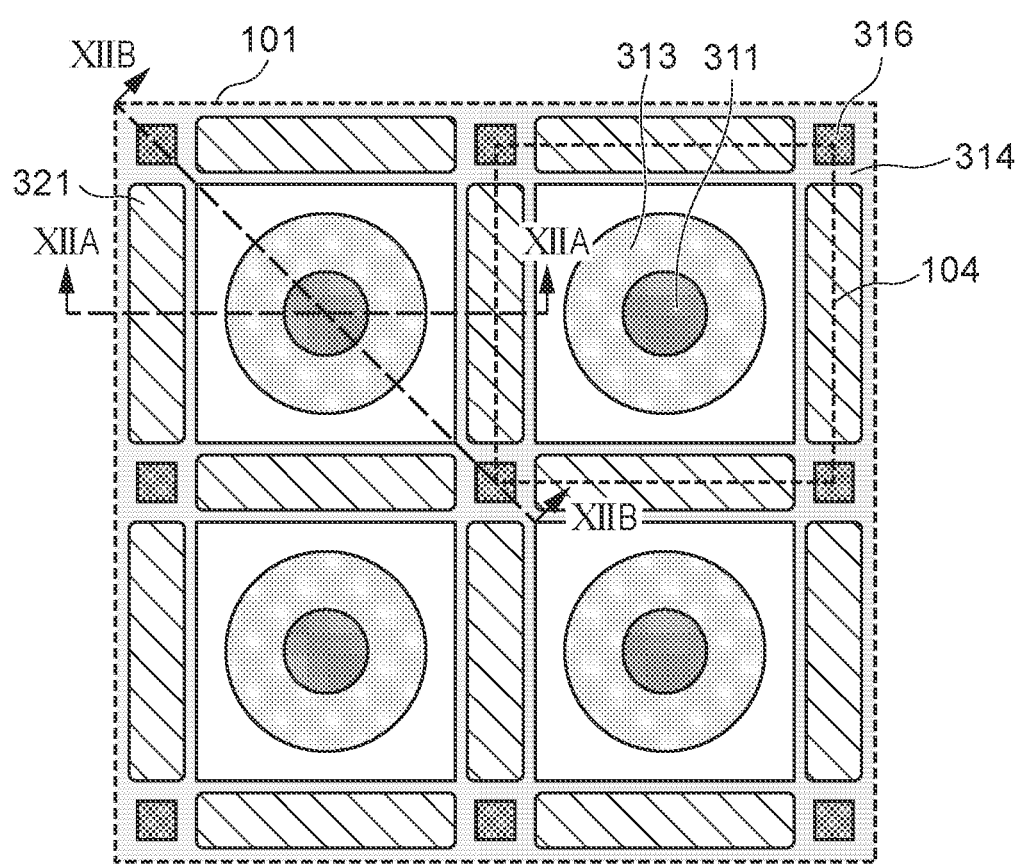
FIG. 11 is a schematic plan view of a photoelectric conversion apparatus according to a second embodiment.

FIG. 11 is a schematic plan view of the semiconductor layer 300, in which APDs are arranged, of the photoelectric conversion apparatus according to the present embodiment.

Figure 12A:
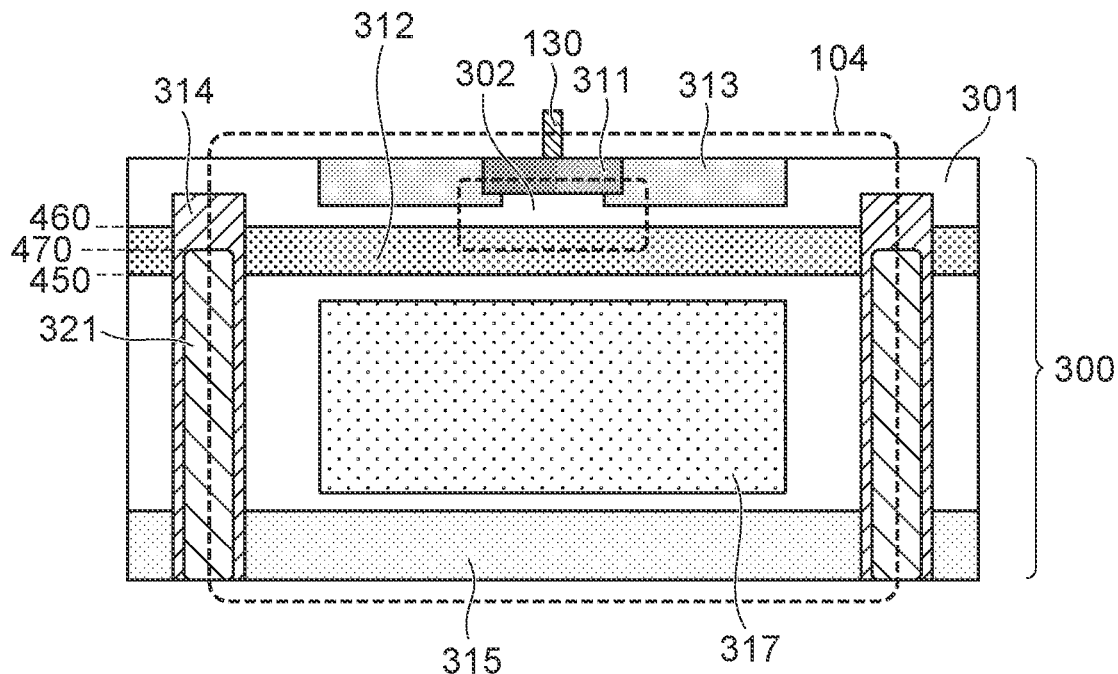
FIGS. 12A and 12B are schematic cross-section diagrams of the photoelectric conversion apparatus according to the second embodiment.

FIG. 12A is a schematic cross-section diagram taken along line XIIA-XIIA of FIG. 11, that is, in the side facing direction. FIG. 10B is a schematic cross-section diagram taken along line XIIB-XIIB of FIG. 11, that is, in the diagonal direction.

In FIG. 12A, the fourth semiconductor region 314 of the second conductivity type has a configuration in which the top surface of the fourth semiconductor region 314 is positioned between the position 460 of the top surface of the second semiconductor region 312 and the top surface (the first surface) of the semiconductor layer 300. That is, in FIG. 12A, the top surface (one end) of the fourth semiconductor region 314 is arranged at a shallower position than the second semiconductor region 312 is and at a deeper position than the first surface of the semiconductor layer 300 is. The fourth semiconductor region 314 is arranged so as to be spaced apart from the first surface of the semiconductor layer 300.

Suppose that, between the first APD and the second APD arranged in the side facing direction with respect to the first APD, the fourth semiconductor region 314 is continuously arranged from the second surface to the first surface of the semiconductor layer 300. In this case, an electric field having at least a certain strength may be generated between the first semiconductor region 311 or the third semiconductor region 313 and the fourth semiconductor region 314. In contrast, in a case where the top surface of the fourth semiconductor region 314 is positioned under the top surface of the second semiconductor region 312, a depletion layer extending laterally from the first semiconductor region 311 of the first APD and a depletion layer extending laterally from the first semiconductor region 311 of the second APD may be connected to each other. As a result, charge crosstalk (punch through) may occur between the first semiconductor region 311 of the first APD and the first semiconductor region 311 of the second APD.

In contrast, according to the present embodiment, the top surface of the fourth semiconductor region 314 is arranged at a position deeper than the first surface and shallower than the top surface of the second semiconductor region 312 in the side facing direction. Thus, while reducing the occurrence of electric field concentration in a lateral direction, punch through can be made less likely to occur.

Figure 12B:
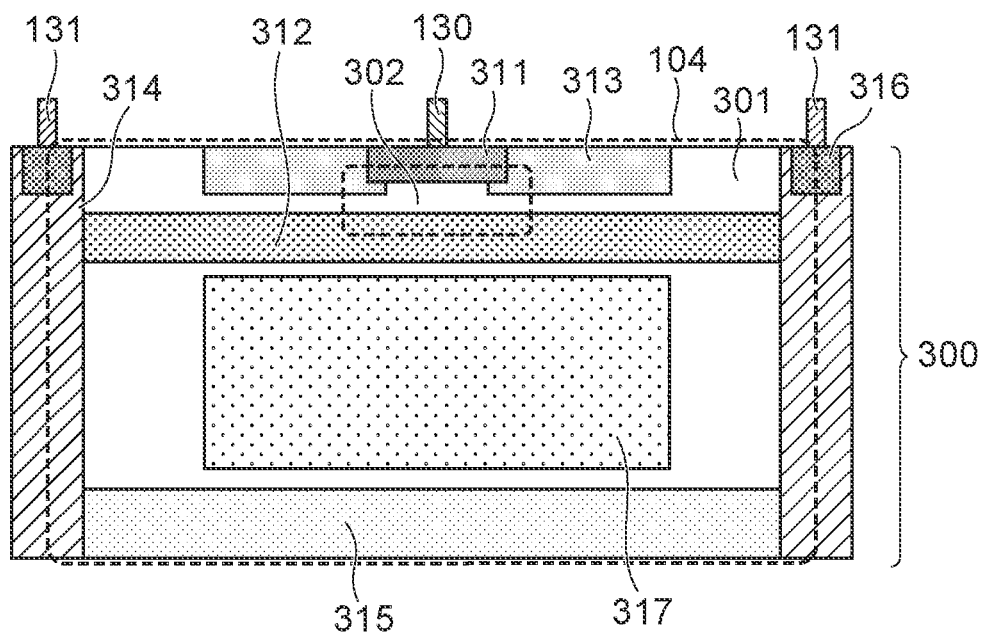

As illustrated in FIG. 12B, in the diagonal direction, the fourth semiconductor region 314 is continuously arranged from the first surface to a depth equal to the depth where the fifth semiconductor region 315 is arranged. The distance between APDs in the diagonal direction is greater than the distance between APDs in the side facing direction. Thus, the distance between the fourth semiconductor region 314 and the first semiconductor region 311 or the third semiconductor region 313 is greater in the diagonal direction than in the side facing direction. Thus, even when the fourth semiconductor region 314 is continuously arranged to the first surface of the semiconductor layer 300, electric field concentration is less likely to occur in a lateral direction in the diagonal direction than in the side facing direction. Thus, with consideration of application of a voltage to the second semiconductor regions 312 via the contact plugs 131 in the diagonal direction, the fourth semiconductor region 314 is continuously arranged to the first surface of the semiconductor layer 300 in the diagonal direction. It is sufficient that the fourth semiconductor region 314 be in contact with the sixth semiconductor regions 316, and thus the fourth semiconductor region 314 does not have to be provided continuously to the first surface of the semiconductor layer 300. It is sufficient that at least the fourth semiconductor region 314 be in contact with the sixth semiconductor regions 316.

Even in the present embodiment, similarly to as in the first embodiment, the trench structures 321 have a configuration in which the top surfaces of the trench structures 321 are positioned between the top and bottom surfaces of the second semiconductor region 312. As a result, a reduction in crosstalk can be achieved, an electric potential can be appropriately applied to the second semiconductor region 312, and power consumption can also be reduced. Moreover, stable avalanche efficiency can be achieved, and a reduction in sensitivity can be reduced.

Note that, similarly to as in the modification of the first embodiment, crosstalk between pixels provided in the diagonal direction can be more greatly reduced even in the present embodiment by arranging the trench structures 321 also in the diagonal direction.

Third Embodiment

A photoelectric conversion apparatus according to a third embodiment will be described with reference to FIGS. 13 to 14B.

The third embodiment differs from the second embodiment in that a ninth semiconductor region 319 of the first conductivity type (for example, N-type) is arranged near the first surface of the semiconductor layer 300.

Figure 13:
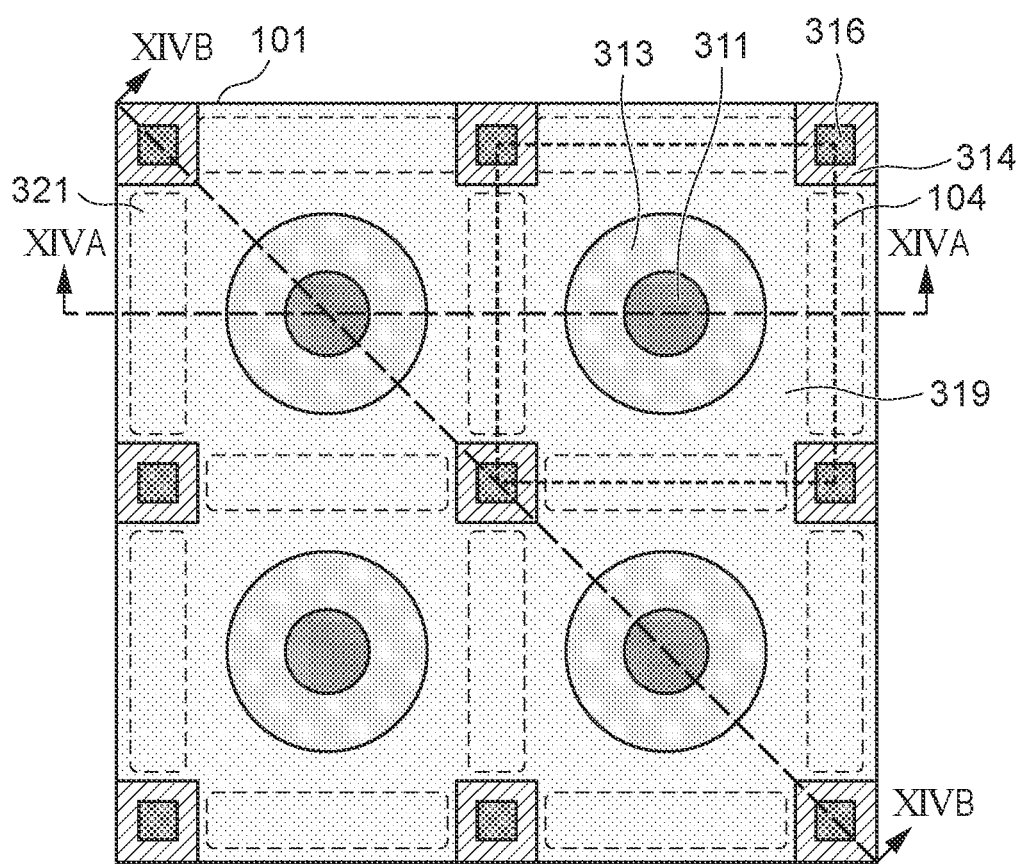
FIG. 13 is a schematic plan view of a photoelectric conversion apparatus according to a third embodiment.

FIG. 13 is a schematic plan view of the semiconductor layer 300, in which APDs are arranged, of the photoelectric conversion apparatus according to the present embodiment.

Figure 14A:
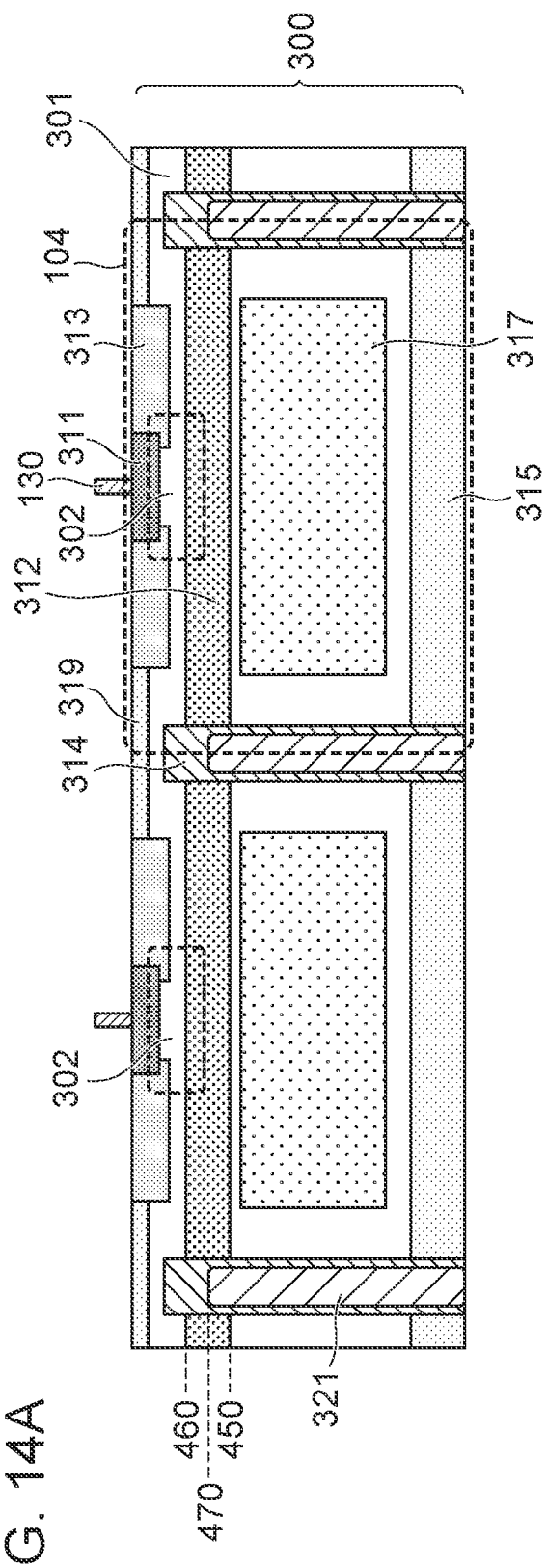
FIGS. 14A and 14B are schematic cross-section diagrams of the photoelectric conversion apparatus according to the third embodiment.

FIG. 14A is a schematic cross-section diagram taken along line XIVA-XIVA of FIG. 13, that is, in the side facing direction. FIG. 14B is a schematic cross-section diagram taken along line XIVB-XIVB of FIG. 13, that is, in the diagonal direction.

As illustrated in FIG. 13, the ninth semiconductor region 319 is arranged so as to surround the first semiconductor regions 311 and the third semiconductor regions 313 in a plan view. The impurity concentration of the ninth semiconductor region 319 is substantially equal to or less than the impurity concentration of the third semiconductor region 313. For example, in a case where the impurity concentration of the ninth semiconductor region 319 differs from that of the third semiconductor region 313, in one embodiment, the impurity concentration of the ninth semiconductor region 319 is at least two times lower than that or the third semiconductor region 313.

By arranging the ninth semiconductor region 319, noise to a signal can be reduced, the noise being due to dark electrons that may be generated by a defect level at the interface of the first surface of the semiconductor layer 300 or near the first surface. By arranging the ninth semiconductor region 319, a region having a low potential with respect to dark electrons can be generated from the ninth semiconductor region 319 toward the first semiconductor region 311. In other words, dark electrons generated at the interface of the first surface of the semiconductor layer 300 or the like are more likely to move to the first semiconductor regions 311 and less likely to move to the semiconductor region 301 or the seventh semiconductor regions 317. Thus, passing of dark electrons through the avalanche multiplication regions 302 can be made less likely to occur, and noise can be reduced. Dark electrons having moved to the first semiconductor regions 311 via the third semiconductor regions 313 are read out without passing through the avalanche multiplication regions 302 and are not determined to be a signal. Thus, even when the dark electrons are read out, the dark electrons do not become noise.

The ninth semiconductor region 319 may be arranged such that, in each pixel 104, the impurity concentration decreases with distance from the first semiconductor region 311 from the fourth semiconductor region 314 side or may also be arranged so as to have a uniform impurity concentration. Moreover, the ninth semiconductor region 319 may have a concentration gradient in the depth direction.

As illustrated in FIG. 14A, between adjacent pixels in the side facing direction, in one embodiment, the ninth semiconductor region 319 is continuously arranged from the third semiconductor region 313 of a first pixel 104 to the third semiconductor region 313 of a second pixel adjacent to the first pixel 104.

As illustrated in FIG. 13, in one embodiment, the ninth semiconductor region 319 is arranged so as to surround the first semiconductor regions 311, the third semiconductor regions 313, the sixth semiconductor regions 316, and the fourth semiconductor region 314 in a plan view. For example, in a plan view, the ninth semiconductor region 319 is arranged in a region other than the first semiconductor regions 311, the third semiconductor regions 313, the sixth semiconductor regions 316, and the fourth semiconductor region 314. As a result, deterioration of signal noise due to dark electrons can be reduced in a broader region.

As illustrated in FIG. 14A, in one embodiment, the bottom surface of the ninth semiconductor region 319 is to be arranged at a shallower position than the bottom surface of the first semiconductor region 311. Moreover, in another embodiment, the length of the ninth semiconductor region 319 in the up-down direction is to be shorter than the length of the third semiconductor region 313 in the up-down direction. Moreover, in yet another embodiment, the length of the ninth semiconductor region 319 in the up-down direction is to be shorter than the length of the first semiconductor region 311 in the up-down direction. As a result, moving of dark electrons unintentionally into the avalanche multiplication region 302 can be reduced.

In the side facing direction, the ninth semiconductor region 319 may be in contact with the fourth semiconductor region 314, or the ninth semiconductor region 319 may be apart from the fourth semiconductor region 314 as illustrated in FIG. 14A. In a case where the ninth semiconductor region 319 is in contact with the fourth semiconductor region 314, electric charge is less likely to move to adjacent pixels. In a case where the ninth semiconductor region 319 is apart from the fourth semiconductor region 314, electric field concentration is less likely to occur between the fourth semiconductor region 314 and the first semiconductor region 311. In the diagonal direction, the ninth semiconductor region 319 is in contact with the fourth semiconductor region 314 as illustrated in FIG. 14B; however, the ninth semiconductor region 319 may be apart from the fourth semiconductor region 314.

Figure 14B:
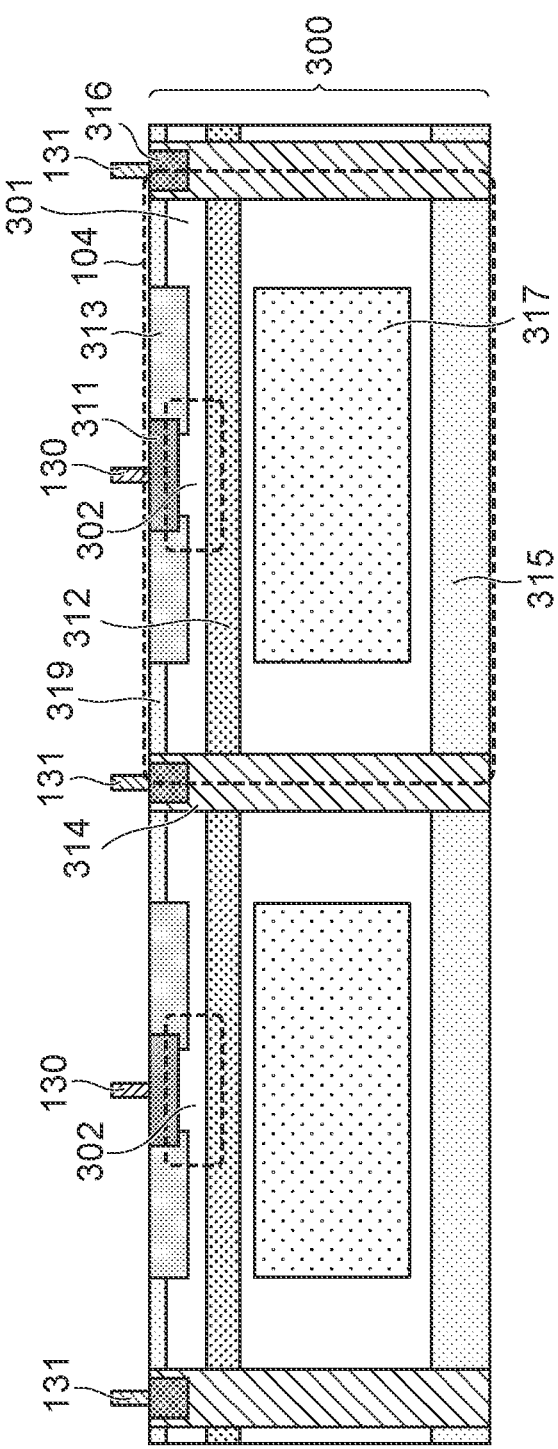

In FIGS. 14A and 14B, the ninth semiconductor region 319 is arranged so as to be in contact with the first surface of the semiconductor layer 300; however, the ninth semiconductor region 319 does not have to be in contact with the first surface of the semiconductor layer 300. For example, the ninth semiconductor region 319 may be arranged at a position apart from the first surface.

In FIGS. 14A and 14B, in each pixel 104, the third semiconductor region 313 and the second semiconductor region 312 are arranged so as to be apart from each other; however, the third semiconductor region 313 and the second semiconductor region 312 may be arranged so as to be in contact with each other.

Figure 15A:
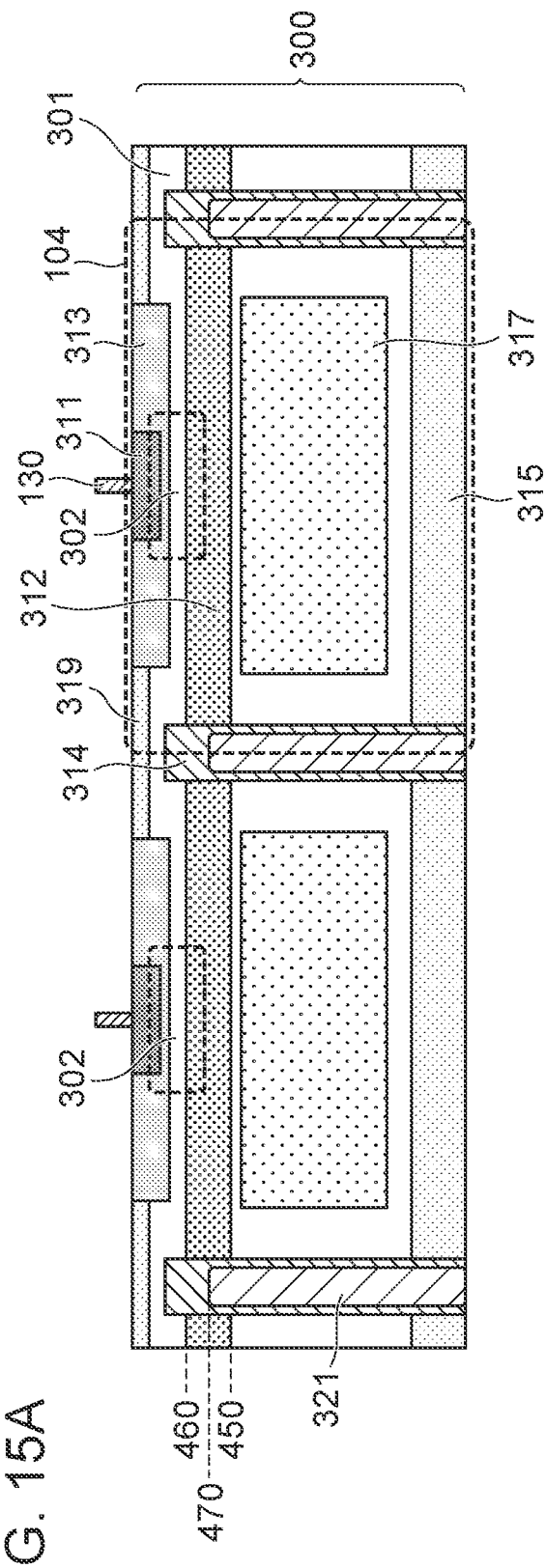
FIGS. 15A and 15B are schematic cross-section diagrams of a photoelectric conversion apparatus according to another example of the third embodiment.
Figure 15B:
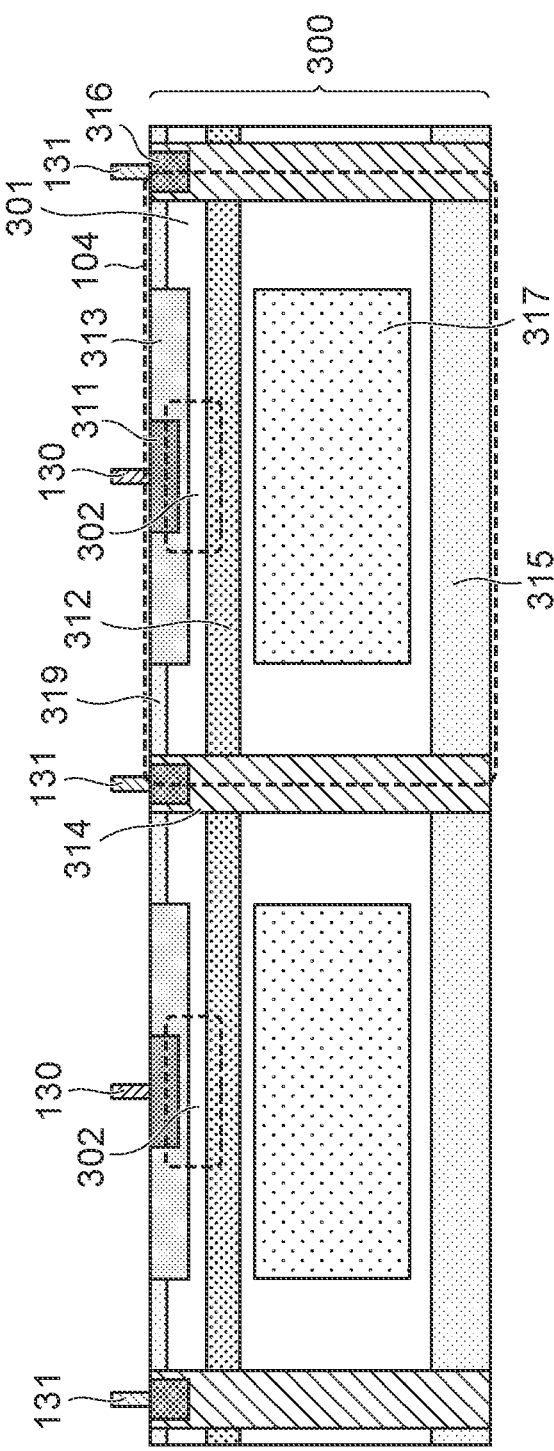

In FIGS. 13 to 14B, the third semiconductor regions 313 have torus shapes. However, as illustrated in FIGS. 15A and 15B, the third semiconductor regions 313 may have circular shapes. In a case where the third semiconductor region 313 has a circular shape in each pixel 104 in this manner, the third semiconductor region 313, which is of the first conductivity type, is arranged between the first semiconductor region 311 and the second semiconductor region 312. By arranging the third semiconductor region 313 between the first semiconductor region 311 and the second semiconductor region 312, the PN junction surface can be made deep, and the electric field in the avalanche multiplication region 302 can be made less likely to locally concentrate. Note that a schematic plan view corresponding to FIGS. 15A and 15B is substantially the same as that of FIG. 13.

In FIGS. 15A and 15B, the impurity concentration of the third semiconductor region 313 near the side surface of the first semiconductor region 311 may be equal to or different from the impurity concentration of the third semiconductor region 313 near the bottom surface of the first semiconductor region 311. For example, a plurality of regions having different impurity concentrations may be provided in the third semiconductor region 313 such that the impurity concentration of the third semiconductor region 313 decreases from the first semiconductor region 311 toward the second semiconductor region 312.

Moreover, in the third semiconductor region 313, the impurity concentration near the first semiconductor region 311 may be lower than the impurity concentration near the ninth semiconductor region 319. For example, in the third semiconductor region 313, the impurity concentration may decrease in a stepwise manner from the side close to the first semiconductor region 311 toward the side away from the first semiconductor region 311. As a result, electric field concentration can be reduced in a lateral direction.

According to the present embodiment, similarly to as in the second embodiment, while making electric field concentration be less likely to occur in a lateral direction, punch through between adjacent APDs can be reduced. Compared with the second embodiment, the effect of signal noise due to dark electrons that may be generated at or near the interface of the first surface of the semiconductor layer 300 can be reduced.

In the present embodiment, similarly to as in the first embodiment, the trench structures 321 have a configuration in which the top surfaces of the trench structures 321 are positioned between the top and bottom surfaces of the second semiconductor region 312. As a result, a reduction in crosstalk can be achieved, an electric potential can be appropriately supplied to the second semiconductor region 312, and power consumption can also be reduced. Moreover, stable avalanche efficiency can be achieved, and a reduction in sensitivity can be reduced.

Modification of Third Embodiment

In the third embodiment described above, the example has been described in which the trench structures 321 are provided in the side facing direction but not in the diagonal direction. However, a photoelectric conversion apparatus may have a configuration in which a trench structure 321 is provided in both of the side facing direction and the diagonal direction.

Figure 16:
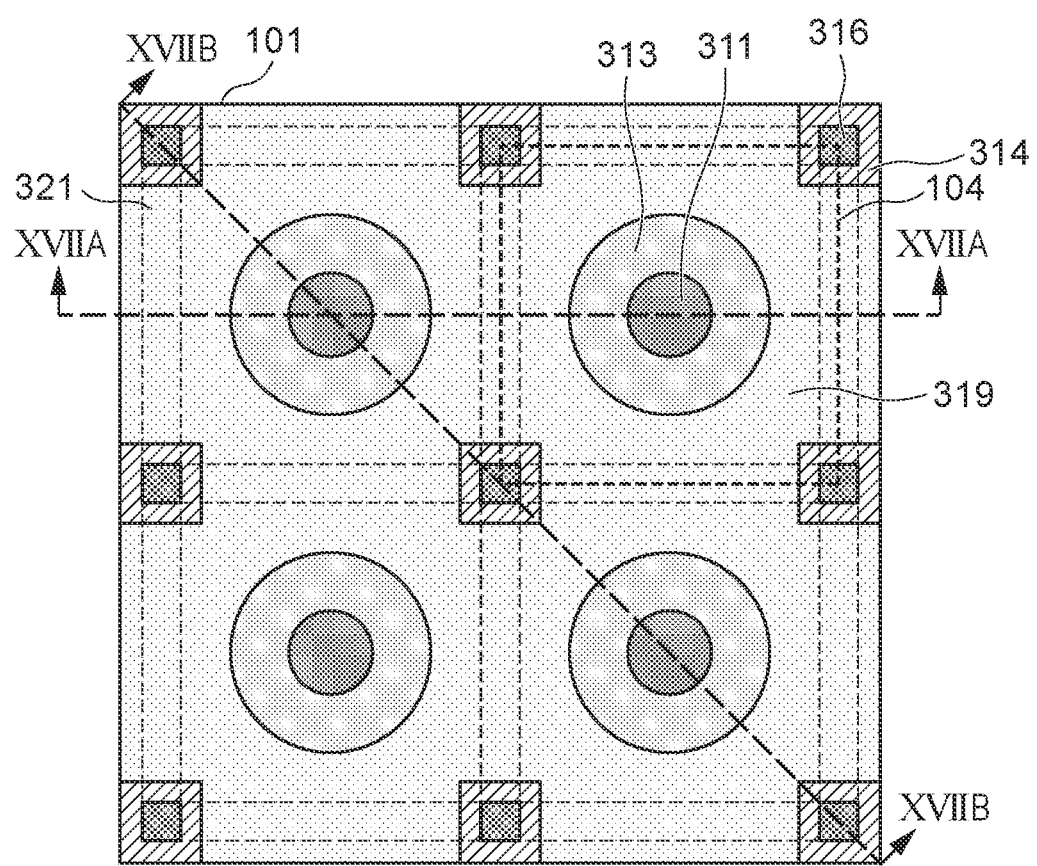
FIG. 16 is a schematic plan view of a photoelectric conversion apparatus according to a modification of the third embodiment.

Specifically, FIG. 16 is a plan view regarding four (2×2) pixels on the first surface of the semiconductor layer 300. In FIG. 16, the trench structure 321 is arranged also at positions overlapping the sixth semiconductor regions 316.

FIG. 17A is a schematic cross-section diagram taken along line XVIIA-XVIIA of FIG. 16, that is, in the side facing direction. FIG. 17B is a schematic cross-section diagram taken along line XVIIB-XVIIB of FIG. 16, that is, in the diagonal direction. As illustrated in FIG. 17B, the trench structure 321 is also arranged in the diagonal direction. Even in FIG. 17B, the trench structure 321 has a configuration in which the top surface of the trench structure 321 is positioned between the position 460 of the top surface of the second semiconductor region 312 and the position 450 of the bottom surface of the second semiconductor region 312. As a result, an electric potential can be appropriately applied to the second semiconductor region 312, and power consumption can be reduced. By arranging the trench structure 321 also in the diagonal direction, crosstalk between pixels arranged in the diagonal direction can be more greatly reduced.

Fourth Embodiment

Figure 18:
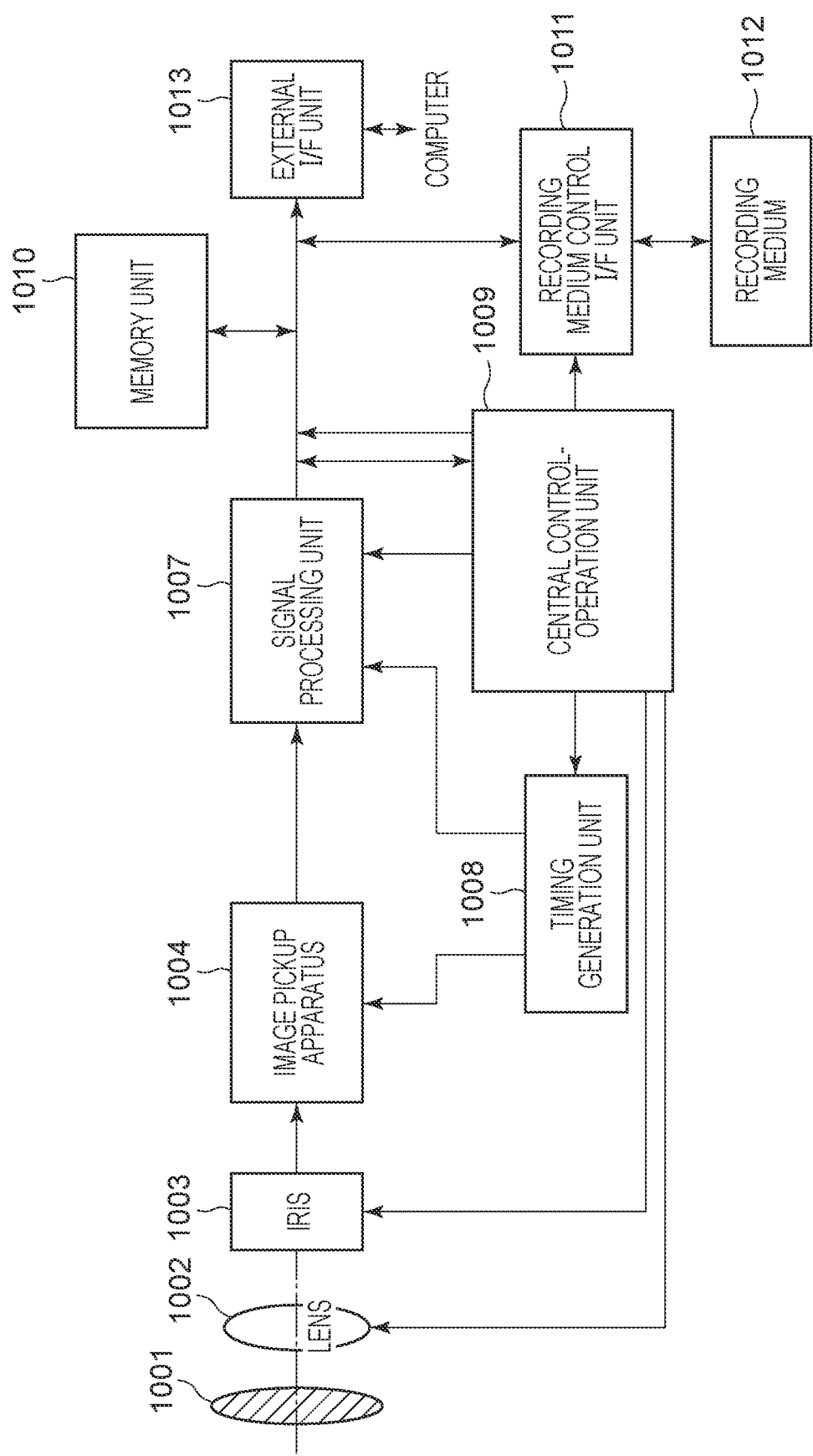
FIG. 18 is a block diagram of a photoelectric conversion system according to a fourth embodiment.

A photoelectric conversion system according to the present embodiment will be described using FIG. 18. FIG. 18 is a block diagram illustrating a schematic configuration of the photoelectric conversion system according to the present embodiment.

The photoelectric conversion apparatuses described in the first to third embodiments described above can be applied to various types of photoelectric conversion systems. Examples of the photoelectric conversion systems to which the photoelectric conversion apparatuses described in the first to third embodiments described above can be applied include digital still cameras, digital camcorders, surveillance cameras, copiers, fax machines, mobile phones, vehicle-mounted cameras, and observation satellites. The examples of the photoelectric conversion systems also include a camera module having an optical system such as a lens and an image pickup apparatus. FIG. 18 illustrates a block diagram of a digital camera as an example from among these examples.

The photoelectric conversion system illustrated in FIG. 18 includes an image pickup apparatus 1004 as an example of the photoelectric conversion apparatuses and a lens 1002 for causing the image pickup apparatus 1004 to form an optical image of a subject. The photoelectric conversion system further includes an iris 1003 for changing the amount of light passing through the lens 1002 and a barrier 1001 for protecting the lens 1002. The lens 1002 and the iris 1003 are an optical system for concentrating light onto the image pickup apparatus 1004. The image pickup apparatus 1004 is any one of the photoelectric conversion apparatuses according to the embodiments described above and converts the optical image formed by the lens 1002 into an electric signal.

The photoelectric conversion system includes a signal processing unit 1007, which is an image generation unit configured to generate an image by performing processing on an output signal output from the image pickup apparatus 1004. The signal processing unit 1007 performs an operation in which various types of correction or compression are performed as needed to output image data. The signal processing unit 1007 may be formed on a semiconductor substrate provided with the image pickup apparatus 1004 or may be formed on another semiconductor substrate different from the semiconductor substrate provided with the image pickup apparatus 1004. Moreover, the image pickup apparatus 1004 and the signal processing unit 1007 may be formed on the same semiconductor substrate.

The photoelectric conversion system further includes a memory unit 1010 for temporarily storing image data and an external interface (I/F) unit 1013 for communicating with an external computer or the like. Furthermore, the photoelectric conversion system includes a recording medium 1012 such as a semiconductor memory for recording or reading out captured image data and a recording medium control OF unit 1011 for recording data in or reading out data from the recording medium 1012. Note that the recording medium 1012 may be built in or detachable from the photoelectric conversion system.

Furthermore, the photoelectric conversion system includes a central control-operation unit 1009, which controls various types of arithmetic operations and the entire digital still camera, and a timing generation unit 1008, which outputs various types of timing signals to the image pickup apparatus 1004 and the signal processing unit 1007. In this case, a timing signal and the like may be input from the outside. It is sufficient that the photoelectric conversion system include at least the image pickup apparatus 1004 and the signal processing unit 1007, which processes an output signal output from the image pickup apparatus 1004.

The image pickup apparatus 1004 outputs an image pickup signal to the signal processing unit 1007. The signal processing unit 1007 performs certain signal processing on the image pickup signal output from the image pickup apparatus 1004 to output image data. The signal processing unit 1007 generates an image using the image pickup signal output from the image pickup apparatus 1004.

In this manner, according to the present embodiment, the photoelectric conversion system can be realized to which any one of the photoelectric conversion apparatuses (image pickup apparatuses) according to the embodiments described above.

Fifth Embodiment

Figure 19A:
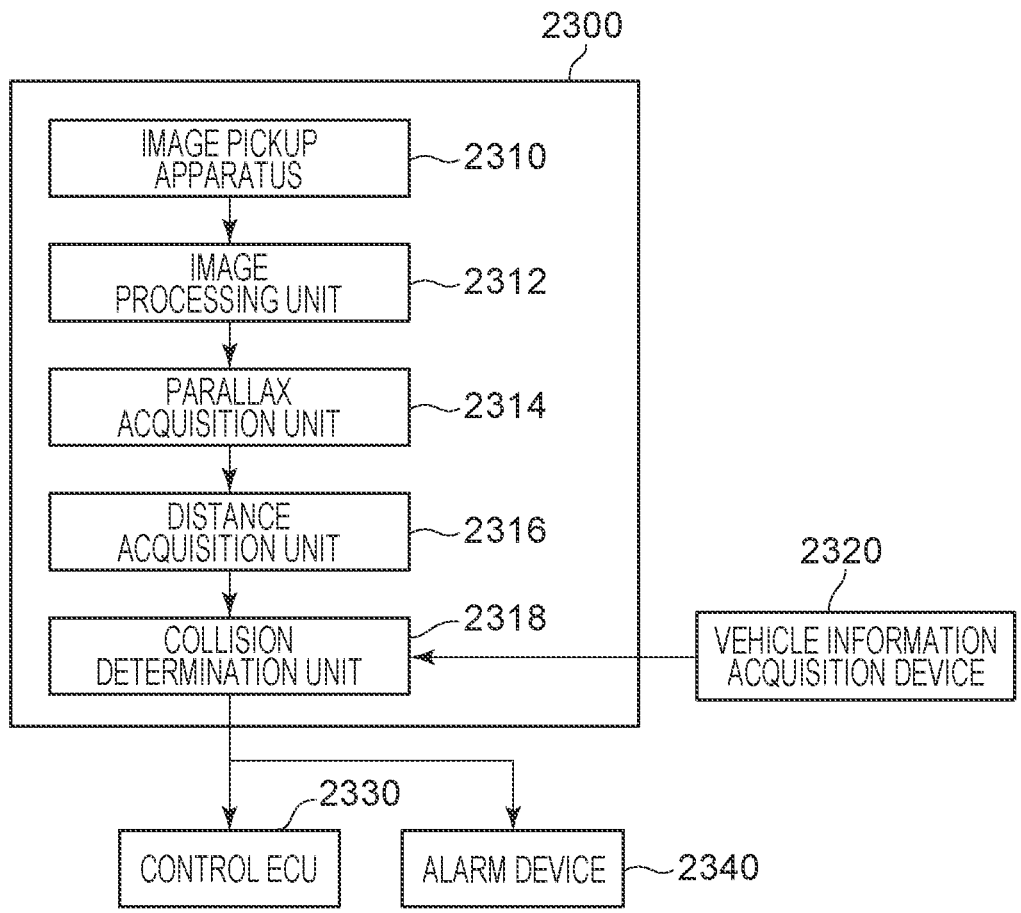
FIGS. 19A and 19B are block diagrams of a photoelectric conversion system according to a fifth embodiment.
Figure 19B:
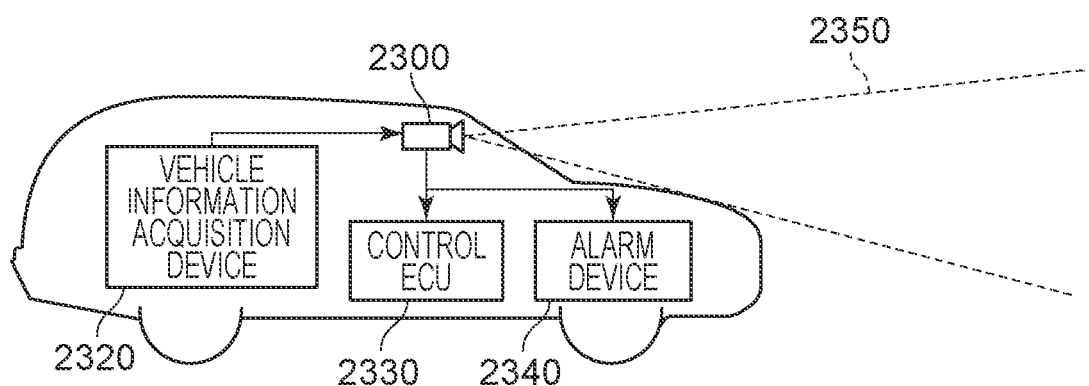

A photoelectric conversion system and a moving object according to the present embodiment will be described using FIGS. 19A and 19B. FIGS. 19A and 19B are diagrams illustrating the configurations of the photoelectric conversion system and the moving object according to the present embodiment.

FIG. 19A illustrates an example of the photoelectric conversion system regarding a vehicle-mounted camera. A photoelectric conversion system 2300 has an image pickup apparatus 2310. The image pickup apparatus 2310 is any one of the photoelectric conversion apparatuses described in the above-described embodiments. The photoelectric conversion system 2300 has an image processing unit 2312, which performs image processing on a plurality of pieces of image data acquired by the image pickup apparatus 2310. The photoelectric conversion system 2300 also has a parallax acquisition unit 2314, which calculates parallax (a phase difference of a parallax image) from a plurality of pieces of image data acquired by the image processing unit 2312. Furthermore, the photoelectric conversion system 2300 has a distance acquisition unit 2316 and a collision determination unit 2318. The distance acquisition unit 2316 calculates the distance to a target object on the basis of the calculated parallax. The collision determination unit 2318 determines on the basis of the calculated distance whether there are chances of a collision. In this case, the parallax acquisition unit 2314 or the distance acquisition unit 2316 is an example of a distance information acquisition unit configured to acquire information regarding the distance to the target object (hereinafter referred to as distance information). That is, the distance information is information regarding parallax, the amount of defocusing, the distance to the target object, and so forth. The collision determination unit 2318 may determine chances of a collision using any information included in the distance information. The distance information acquisition unit may be realized by a hardware device designed in a dedicated manner or a software module. The distance information acquisition unit may also be realized by, for example, a field-programmable gate array (FPGA) or an application-specific integrated circuit (ASIC) or may also be realized by a combination of an FPGA and an ASIC.

The photoelectric conversion system 2300 is connected to a vehicle information acquisition device 2320 and can acquire vehicle information such as a vehicle speed, a yaw rate, and a steering angle. Moreover, a control engine control unit (ECU) 2330 is connected to the photoelectric conversion system 2300. The control ECU 2330 is a control device (a controller) that outputs, on the basis of a determination result from the collision determination unit 2318, a control signal for causing the vehicle to generate a braking force. Moreover, the photoelectric conversion system 2300 is also connected to an alarm device 2340, which alerts the driver on the basis of a determination result from the collision determination unit 2318. For example, in a case where the chances of a collision are high based on a determination result from the collision determination unit 2318, the control ECU 2330 performs vehicle control to avoid a collision or reduce damage by braking, releasing the accelerator, controlling the engine output, or the like.

The alarm device 2340 alerts the user by going off an alarm such as certain sound, displaying alarm information on the screen of, for example, a car navigation system, or vibrating their seat belt or the steering wheel.

In the present embodiment, images around the vehicle, for example, images of views in front of or behind the vehicle are captured by the photoelectric conversion system 2300. FIG. 19B illustrates the photoelectric conversion system for a case where images of views in front of the vehicle (an image pickup area 2350) are captured. The vehicle information acquisition device 2320 sends a command to the photoelectric conversion system 2300 or the image pickup apparatus 2310. With such a configuration, the accuracy of distance measurement can be more greatly improved.

In the above, an example has been described in which control for preventing the vehicle from colliding with other vehicles. However, the photoelectric conversion system 2300 can also be applied to perform, for example, control under which the vehicle drives autonomously so as to follow other vehicles or control under which the vehicle drives autonomously so as not to drive out of the lane. Furthermore, the photoelectric conversion system 2300 can be applied not only to vehicles such as the vehicle having the photoelectric conversion system 2300 but also to, for example, moving objects (moving apparatuses) such as vessels, airplanes, or industrial robots. In addition, the photoelectric conversion system 2300 can be applied not only to moving objects but also to a wide range of apparatuses using object recognition such as an intelligent transportation system (ITS).

Sixth Embodiment

Figure 20:
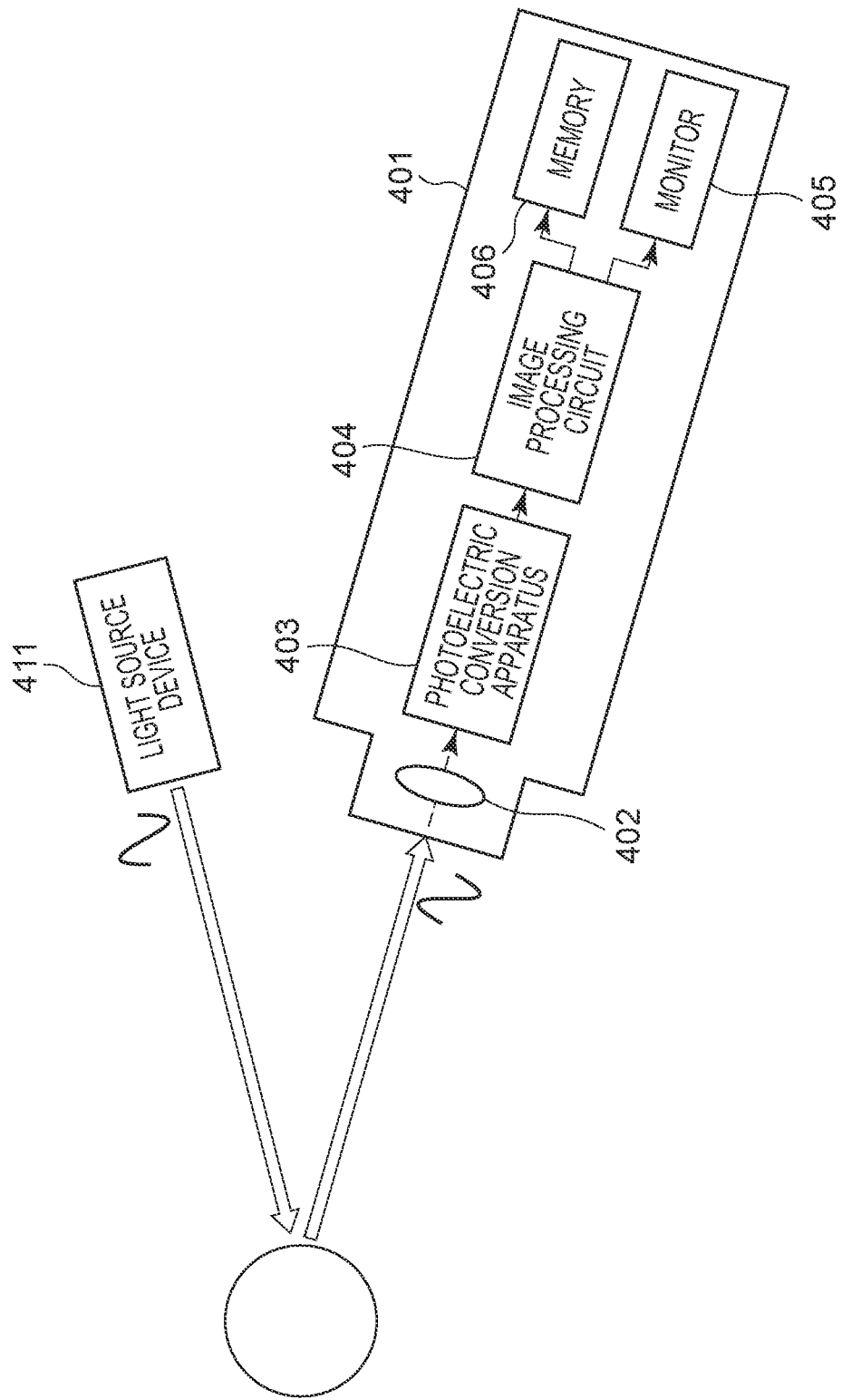
FIG. 20 is a block diagram of a photoelectric conversion system according to a sixth embodiment.

A photoelectric conversion system according to the present embodiment will be described using FIG. 20. FIG. 20 is a block diagram illustrating an example of the configuration of a distance image sensor, which is a photoelectric conversion system.

As illustrated in FIG. 20, a distance image sensor 401 includes an optical system 402, a photoelectric conversion apparatus 403, an image processing circuit 404, a monitor 405, and a memory 406. The distance image sensor 401 receives light emitted from a light source device 411 to a subject and reflected by the surface of the subject (modulated light or pulsed light) and consequently can acquire a distance image corresponding to the distance to the subject.

The optical system 402 includes one or more lenses. The optical system 402 guides image light (incident light) from the subject to the photoelectric conversion apparatus 403, and causes an image to be formed on a light receiving surface (a sensor unit) of the photoelectric conversion apparatus 403.

As the photoelectric conversion apparatus 403, any one of the photoelectric conversion apparatuses described in the first to fourth embodiments described above is used. A distance signal representing a distance obtained from a light reception signal and output from the photoelectric conversion apparatus 403 is supplied to the image processing circuit 404.

The image processing circuit 404 performs image processing in which a distance image is constructed on the basis of the distance signal supplied from the photoelectric conversion apparatus 403. The distance image (image data) obtained as a result of the image processing is supplied to and displayed on the monitor 405 or is supplied to and stored (recorded) in the memory 406.

In the distance image sensor 401 configured in this manner, the characteristics of pixels are improved by using one of the photoelectric conversion apparatuses described above and consequently, for example, a more accurate distance image can be acquired.

Seventh Embodiment

Figure 21:
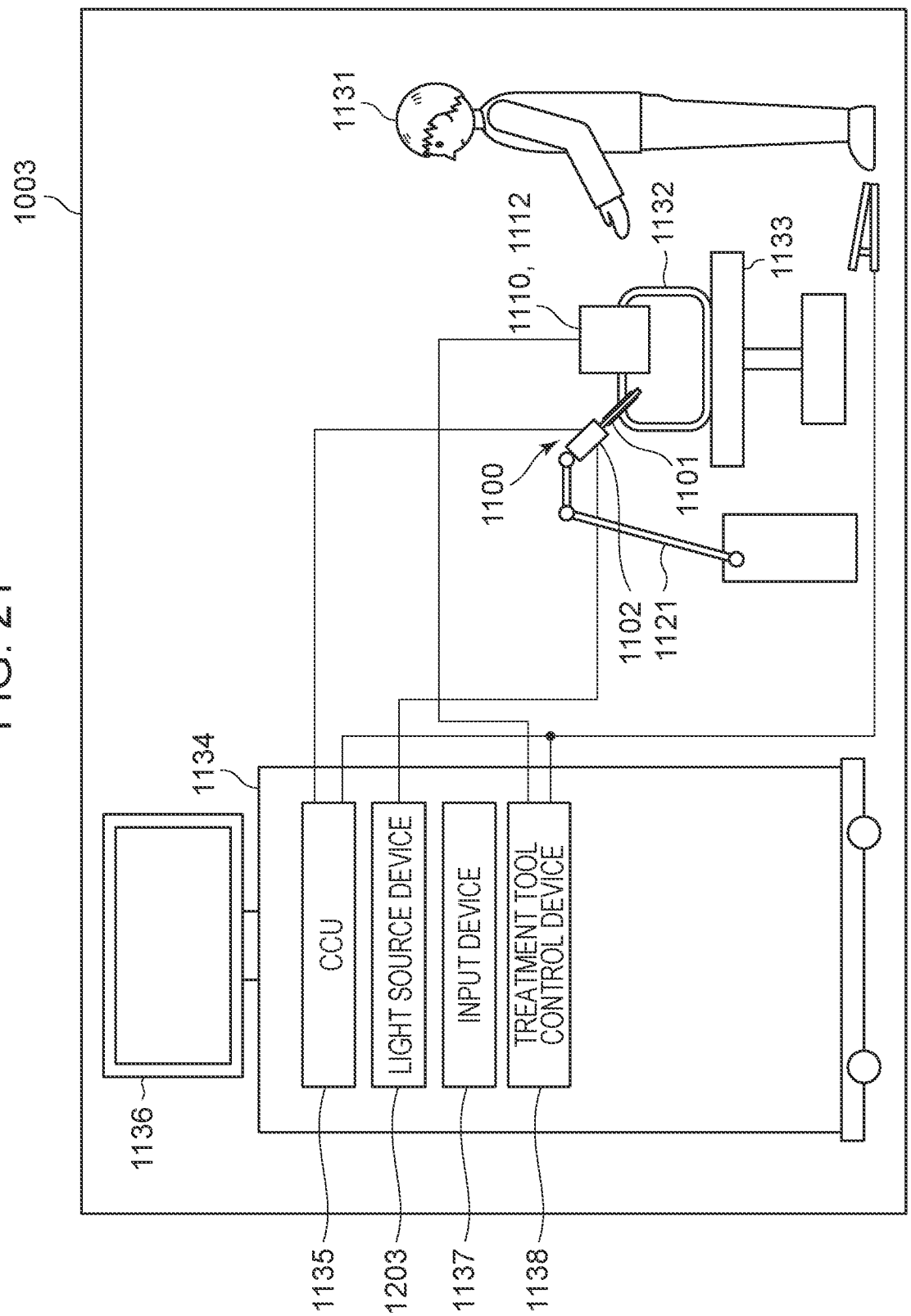
FIG. 21 is a block diagram of a photoelectric conversion system according to a seventh embodiment.

A photoelectric conversion system according to the present embodiment will be described using FIG. 21. FIG. 21 is a diagram illustrating an example of a schematic configuration of an endoscopic operation system, which is a photoelectric conversion system according to the present embodiment.

FIG. 21 illustrates a situation in which a practitioner (a doctor) 1131 is performing a surgical operation on a patient 1132 on a patient bed 1133 by using an endoscopic operation system 1003. As illustrated in FIG. 21, the endoscopic operation system 1003 includes an endoscope 1100, a surgical tool 1110, and a cart 1134, on which various types of devices for endoscopic operations are mounted.

The endoscope 1100 includes a lens tube 1101 and a camera head 1102. A portion of the lens tube 1101 starting from its leading edge and having a predetermined length is inserted into a body cavity of the patient 1132. The camera head 1102 is connected to a base end of the lens tube 1101. In the illustrated example, the endoscope 1100 is formed as a rigid scope including the lens tube 1101, which is rigid; however, the endoscope 1100 may be formed as a so-called flexible scope having a flexible lens tube.

The leading edge of the lens tube 1101 is provided with an opening in which an objective lens is embedded. The endoscope 1100 is connected to a light source device 1203. Light generated by the light source device 1203 is guided to the leading edge of the lens tube 1101 along a light guide extended in the lens tube 1101. Light guided to the leading edge of the lens tube 1101 is emitted toward an observation target in the body cavity of the patient 1132 through the objective lens. Note that the endoscope 1100 may be a direct-viewing endoscope, an oblique-viewing endoscope, or a side-viewing endoscope.

The camera head 1102 includes an optical system and a photoelectric conversion apparatus. Reflected light (observation light) from the observation target is concentrated by the optical system onto the photoelectric conversion apparatus. The observation light is photoelectrically converted by the photoelectric conversion apparatus, and an electric signal corresponding to the observation light, that is, an image signal corresponding to an observation image is generated. As the photoelectric conversion apparatus, any one of the photoelectric conversion apparatuses described in the first to fourth embodiments described above can be used. The image signal is transmitted as RAW data to a camera control unit (CCU) 1135.

The CCU 1135 includes, for example, a central processing unit (CPU) and a graphics processing unit (GPU), and performs central control on operations of the endoscope 1100 and a display device 1136. Furthermore, the CCU 1135 receives an image signal from the camera head 1102, and performs, on the image signal, various types of image processing for displaying an image based on the image signal such as development processing (demosaicing) or the like.

The display device 1136 displays, under control performed by the CCU 1135, the image based on the image signal on which image processing is performed by the CCU 1135.

The light source device 1203 includes, for example, a light source such as a light-emitting diode (LED) and supplies, to the endoscope 1100, illumination light to be used when an image of a surgical target or the like is captured.

An input device 1137 is an input interface for the endoscopic operation system 1003. The user can input various types of information or commands to the endoscopic operation system 1003 through the input device 1137.

A treatment tool control device 1138 controls driving of an energy treatment tool 1112 for ablating or dissecting tissue, closing a blood vessel, or the like.

The light source device 1203 supplies, to the endoscope 1100, illumination light to be used when an image of a surgical target is captured. The light source device 1203 includes a white light source formed by, for example, LEDs, laser light sources, or a combination of LEDs and laser light sources. In a case where the white light source is formed by a combination of RGB laser light sources, the output intensity and the output timing of each color (each wavelength) can be controlled with high accuracy, and thus the white balance of a captured image can be adjusted by the light source device 1203. Moreover, in this case, by irradiating an observation target with laser light from each of the RGB laser light sources in a time division manner and controlling driving of an image sensor of the camera head 1102 in synchronization with the irradiation timing, images corresponding to R, G, and B in a respective manner can be captured in a time division manner. With the method, the image sensor can capture color images without being provided with color filters.

Driving of the light source device 1203 may be controlled such that the intensity of output light is changed every certain time period. Images are acquired in a time division manner by controlling driving of the image sensor of the camera head 1102 in synchronization with the timing at which the intensity of the light is changed, and the images are combined. As a result, high dynamic range images without so-called crushed shadows and blown highlights can be generated.

The light source device 1203 may also be configured to be able to supply light having a predetermined wavelength band corresponding to special light observation. In special light observation, for example, the wavelength dependence of light absorption in body tissue is used. Specifically, by performing irradiation with light of a narrower band than the illumination light used at the time of a normal observation (that is, white light), images of certain tissue such as a blood vessel in a mucosal surface layer can be captured with high contrast.

Alternatively, in special light observation, fluorescence observation may be performed in which an image is obtained using fluorescence generated by excitation light irradiation. In fluorescence observation, for example, body tissue is irradiated with excitation light, and fluorescence from the body tissue can be observed. Alternatively, in fluorescence observation, a reagent such as indocyanine green (ICG) is locally injected to body tissue, and the body tissue is irradiated with excitation light corresponding to the fluorescence wavelength of the reagent, so that a fluorescence image can be obtained. The light source device 1203 may be configured to be able to supply at least one out of light of a narrow band and excitation light that correspond to such special light observation.

Eighth Embodiment

Figure 22A:
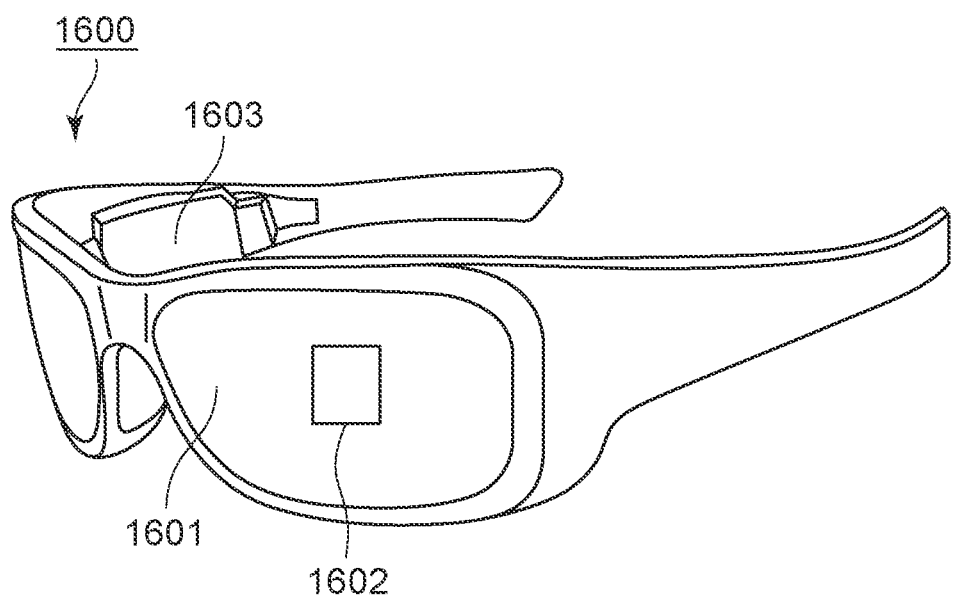
FIGS. 22A and 22B are diagrams illustrating specific examples of a photoelectric conversion system according to an eighth embodiment.

A photoelectric conversion system according to the present embodiment will be described using FIGS. 22A and 22B. FIG. 22A illustrates glasses 1600 (smart glasses), which are a photoelectric conversion system.

The glasses 1600 have a photoelectric conversion apparatus 1602. The photoelectric conversion apparatus 1602 is one of the photoelectric conversion apparatuses described in the first to fourth embodiments described above. A display device including a luminescent device such as an organic light-emitting diode (OLED) or a light-emitting diode (LED) may be provided on the back side of a lens 1601. There may be one photoelectric conversion apparatus 1602 or more. Alternatively, a plurality of types of photoelectric conversion apparatuses may be combined and used. The photoelectric conversion apparatus 1602 does not have to be arranged at the position illustrated in FIG. 22A.

The glasses 1600 further have a control device 1603. The control device 1603 functions as a power source that supplies power to the photoelectric conversion apparatus 1602 and the display device described above. The control device 1603 controls the operation of the photoelectric conversion apparatus 1602 and the display device. In the lens 1601, an optical system is formed that concentrate light onto the photoelectric conversion apparatus 1602.

Figure 22B:
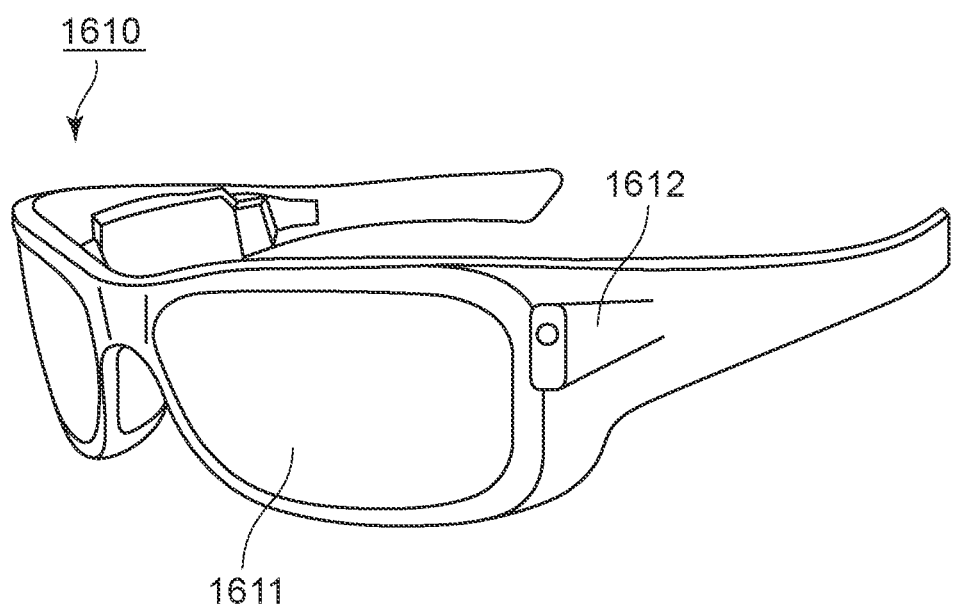

FIG. 22B illustrates glasses 1610 (smart glasses) according to one application. The glasses 1610 have a control device 1612. The control device 1612 includes a photoelectric conversion apparatus corresponding to the photoelectric conversion apparatus 1602 and a display device. In a lens 1611, an optical system is formed that projects light emitted from the photoelectric conversion apparatus and the display device included in the control device 1612. An image is projected onto the lens 1611. The control device 1612 functions as a power source that supplies power to the photoelectric conversion apparatus and the display device, and controls the operation of the photoelectric conversion apparatus and the display device. The control device 1612 may have a line-of-sight detection unit configured to detect the line of sight of the wearer. Infrared rays may be used to detect the line of sight of the wearer. An infrared-emitting unit emits infrared light to an eyeball of the user gazing at a displayed image. An image of their eyeball is captured by an image capturing unit, which has a light reception element, detecting reflected light of the emitted infrared light from their eyeball. A decrease in the quality of images is reduced by provision of a reduction unit that reduces the amount of light from the infrared-emitting unit to a display unit in a plan view.

The line of sight of the user to the displayed image is detected from the image of their eyeball captured through image capturing using infrared light. A freely chosen known method can be applied to line-of-sight detection using a captured image of their eyeball. As an example, a line-of-sight detection method based on Purkinje images generated by reflected illumination light from the user's cornea can be used.

More specifically, line-of-sight detection processing based on a pupil-corneal reflection method is performed. The line of sight of the user is detected by calculating, using a pupil-corneal reflection method, a line-of-sight vector representing the orientation of their eyeball (a rotation angle) on the basis of an image of their pupil and Purkinje images included in a captured image of their eyeball.

The display device according to the present embodiment has a photoelectric conversion apparatus having a light reception element, and may control an image displayed on the display device on the basis of information regarding the user's line of sight from the photoelectric conversion apparatus.

Specifically, for the display device, a first line-of-sight region, at which the user gazes, and a second line-of-sight region other than the first line-of-sight region are determined on the basis of the line-of-sight information. The first line-of-sight region and the second line-of-sight region may be determined by the control device of the display device. Alternatively, the first line-of-sight region and the second line-of-sight region determined by an external control device may be received. In a display region of the display device, the display resolution of the first line-of-sight region may be controlled to be higher than that of the second line-of-sight region. That is, the resolution of the second line-of-sight region may be made lower than that of the first line-of-sight region.

The display region has a first display region and a second display region, which is different from the first display region. A prioritized region may be determined from among the first display region and the second display region on the basis of the line-of-sight information. The first display region and the second display region may be determined by the control device of the display device. Alternatively, the first display region and the second display region determined by an external control device may be received. The resolution of the prioritized region may be controlled to be higher than that of the region other than the prioritized region. That is, the resolution of the region having a relatively low priority may be reduced.

Note that artificial intelligence (AI) may be used to determine the first line-of-sight region or the prioritized region. AI may be a model configured to use an image of a users eyeball and the direction in which their eyeball in the image actually sees as supervised data and to estimate the angle of the line of sight from an image of a user's eyeball and the distance to a target ahead of the line of sight. The display device, the photoelectric conversion apparatus, or an external device may have an AI program. In a case where an external device has the AI program, the angle of the line of sight of the user and the distance to the target are transferred to the display device through communication.

In a case where display control is performed on the basis of visual recognition and detection, the present embodiment can be applied to smart glasses further having a photoelectric conversion apparatus that captures an outside image. The smart glasses can display, in real time, outside information regarding a captured outside image.

The embodiments described above can be changed as appropriate within a range that does not depart from the technical concept. In addition, an example obtained by adding part of any one of the embodiments to another one of the embodiments and an example obtained by replacing part of one of the embodiments with part of another one of the embodiments are also included in embodiments of the disclosure. Furthermore, the photoelectric conversion systems according to the fifth to eighth embodiments are examples of photoelectric conversion systems to which the photoelectric conversion apparatuses can be applied. The photoelectric conversion systems to which photoelectric conversion apparatuses according to the aspect of the embodiments are applicable are not limited to the configurations illustrated in FIGS. 18 to 22B.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-047086, filed Mar. 22, 2021, which is hereby incorporated by reference herein in its entirety.

What is claimed is:

1. A photoelectric conversion apparatus comprising:
   a semiconductor layer including a plurality of photoelectric conversion elements and having a first surface and a second surface, which is a surface on an opposite side to the first surface and on which light is incident, wherein
   each of the plurality of photoelectric conversion elements includes an avalanche photodiode,
   the avalanche photodiode has a first semiconductor region of a first conductivity type and a second semiconductor region of a second conductivity type, the first semiconductor region being a region where charges having the same polarity as that of signal charges are treated as majority carriers, the plurality of photoelectric conversion elements are separated from each other by a respective separators including a third semiconductor region of the second conductivity type, the second semiconductor region is arranged so as to be in contact with the third semiconductor region, the plurality of photoelectric conversion elements include a first photoelectric conversion element and a second photoelectric conversion element, which are aligned in a first direction, a separator provided between the first photoelectric conversion element and the second photoelectric conversion element has a trench structure extending from a side where the second surface side is provided toward a side where the first surface is provided, the trench structure is arranged such that a top surface of the trench structure is positioned between a top surface of the second semiconductor region and a bottom surface of the second semiconductor region, and the third semiconductor region is arranged between the first photoelectric conversion element and the second photoelectric conversion element such that a top surface of the third semiconductor region is positioned between the first surface of the semiconductor layer and the top surface of the second semiconductor region.

2. The photoelectric conversion apparatus according to claim 1, wherein the plurality of photoelectric conversion elements include the first photoelectric conversion element and a third photoelectric conversion element, which are aligned in a second direction crossing the first direction.

3. The photoelectric conversion apparatus according to claim 2, wherein a separator provided between the first photoelectric conversion element and the third photoelectric conversion element has the trench structure, and the trench structure is provided between the first photoelectric conversion element and the third photoelectric conversion element such that the top surface of the trench structure is arranged at a position between the top surface of the second semiconductor region and the bottom surface of the second semiconductor region.

4. The photoelectric conversion apparatus according to claim 2, wherein a separator provided between the first photoelectric conversion element and the third photoelectric conversion element does not have a trench structure.

5. The photoelectric conversion apparatus according to claim 2, wherein the first direction is a side facing direction, and the second direction is a diagonal direction.

6. The photoelectric conversion apparatus according to claim 2, wherein between the first photoelectric conversion element and the third photoelectric conversion element, a contact plug is connected to the first surface.

7. The photoelectric conversion apparatus according to claim 6, wherein a voltage is applied to the second semiconductor region through the contact plug and the third semiconductor region.

8. The photoelectric conversion apparatus according to claim 1, wherein a fourth semiconductor region of the first conductivity type is continuously arranged between the first semiconductor region of the first photoelectric conversion element and the first semiconductor region of the second photoelectric conversion element, an impurity concentration of the fourth semiconductor region is lower than an impurity concentration of the first semiconductor region, and the fourth semiconductor region forms part of the first surface.

9. The photoelectric conversion apparatus according to claim 8, wherein the fourth semiconductor region has a first portion having a first impurity concentration and a second portion having an impurity concentration lower than the first portion, the second portion being farther from the first semiconductor region than the first portion is.

10. The photoelectric conversion apparatus according to claim 1, wherein a fifth semiconductor region of the second conductivity type is arranged on a side where the second surface of the semiconductor layer is provided with respect to the second semiconductor region, and a sixth semiconductor region of the first conductivity type is provided between the second semiconductor region and the fifth semiconductor region.

11. The photoelectric conversion apparatus according to claim 10, wherein an impurity concentration of the sixth semiconductor region is lower than an impurity concentration of the first semiconductor region.

12. The photoelectric conversion apparatus according to claim 1, wherein the third semiconductor region arranged between the first photoelectric conversion element and the second photoelectric conversion element forms part of the first surface of the semiconductor layer.

13. The photoelectric conversion apparatus according to claim 1, wherein an oxide film is arranged in the trench structure.

14. The photoelectric conversion apparatus according to claim 1, wherein oxide films and at least one out of air and metal are arranged in the trench structure, and the at least one out of air and metal is arranged so as to be held between the oxide films.

15. A photoelectric conversion system comprising:

the photoelectric conversion apparatus according to claim 1; and a signal processing unit configured to generate an image using a signal output by the photoelectric conversion apparatus.

16. A moving object including the photoelectric conversion apparatus according to claim 1, the moving object comprising:

a controller configured to control movement of the moving object using a signal output by the photoelectric conversion apparatus.

17. A photoelectric conversion apparatus comprising:

a semiconductor layer including a plurality of photoelectric conversion elements and having a first surface and a second surface, which is a surface on an opposite side to the first surface and on which light is incident, wherein each of the plurality of photoelectric conversion elements includes an avalanche photodiode, the avalanche photodiode has a first semiconductor region of a first conductivity type and a second semiconductor region of a second conductivity type, the first semiconductor region being a region where charges having the same polarity as that of signal charges are treated as majority carriers, the plurality of photoelectric conversion elements are separated from each other by a respective separators including a third semiconductor region of the second conductivity type, the second semiconductor region is arranged so as to be in contact with the third semiconductor region, the plurality of photoelectric conversion elements include a first photoelectric conversion element and a second photoelectric conversion element, which are aligned in a first direction, a separator provided between the first photoelectric conversion element and the second photoelectric conversion element has a trench structure extending from a side where the second surface side is provided toward a side where the first surface is provided, the trench structure is arranged such that a top surface of the trench structure is positioned between a top surface of the second semiconductor region and a bottom surface of the second semiconductor region, a fourth semiconductor region of the first conductivity type is continuously arranged between the first semiconductor region of the first photoelectric conversion element and the first semiconductor region of the second photoelectric conversion element, an impurity concentration of the fourth semiconductor region is lower than an impurity concentration of the first semiconductor region, and the fourth semiconductor region forms part of the first surface.

18. A photoelectric conversion apparatus comprising:

a semiconductor layer including a plurality of photoelectric conversion elements and having a first surface and a second surface, which is a surface on an opposite side to the first surface and on which light is incident, wherein each of the plurality of photoelectric conversion elements includes an avalanche photodiode, the avalanche photodiode has a first semiconductor region of a first conductivity type and a second semiconductor region of a second conductivity type, the first semiconductor region being a region where charges having the same polarity as that of signal charges are treated as majority carriers, the plurality of photoelectric conversion elements are separated from each other by a respective separators including a third semiconductor region of the second conductivity type, the second semiconductor region is arranged so as to be in contact with the third semiconductor region, the plurality of photoelectric conversion elements include a first photoelectric conversion element and a second photoelectric conversion element, which are aligned in a first direction, a separator provided between the first photoelectric conversion element and the second photoelectric conversion element has a trench structure extending from a side where the second surface side is provided toward a side where the first surface is provided, the trench structure is arranged such that a top surface of the trench structure is positioned between a top surface of the second semiconductor region and a bottom surface of the second semiconductor region, a fifth semiconductor region of the second conductivity type is arranged on a side where the second surface of the semiconductor layer is provided with respect to the second semiconductor region, and a sixth semiconductor region of the first conductivity type is provided between the second semiconductor region and the fifth semiconductor region.

\* \* \* \* \*